United States Patent [19]
Sakano et al.

[11] Patent Number: 5,767,555
[45] Date of Patent: Jun. 16, 1998

[54] COMPOUND SEMICONDUCTOR DEVICE CONTROLLED BY MIS GATE, DRIVING METHOD THEREFOR AND ELECTRIC POWER CONVERSION DEVICE USING THE COMPOUND SEMICONDUCTOR DEVICE AND THE DRIVING METHOD

[75] Inventors: Junichi Sakano; Hideo Kobayashi, both of Hitachi; Masahiro Nagasu, Hitachinaka; Mutsuhiro Mori, Mito, all of Japan

[73] Assignee: Hitachi, Ltd., Tokyo, Japan

[21] Appl. No.: 612,457

[22] Filed: Mar. 7, 1996

[30] Foreign Application Priority Data

Mar. 9, 1995 [JP] Japan .................................. 7-049938
Jun. 1, 1995 [JP] Japan .................................. 7-134910
Jan. 26, 1996 [JP] Japan .................................. 8-011513

[51] Int. Cl.$^6$ .................................................. H01L 29/76
[52] U.S. Cl. ........................... 257/401; 257/140; 257/368; 257/168
[58] Field of Search ................................. 257/401, 133, 257/140, 146, 168, 368, 365

[56] References Cited

U.S. PATENT DOCUMENTS 5,357,120  10/1994  Mori ............................................. 257/38

FOREIGN PATENT DOCUMENTS

A-4-196359   7/1992   Japan .

OTHER PUBLICATIONS

N. Iwamuro et al., "A Study of EST's Short–Circuit SOA", Proceeding of 1993 Int'l Conferences on Power Semiconductor Devices and ICs, Tokyo, May 1993 pp. 71–76.

S.M. Sze, "Physics of Semiconductor Devices", 2nd ed. John Wiley & Sons, 1981, p. 108., Dec. 1981.

*Primary Examiner*—Mark V. Prenty
*Attorney, Agent, or Firm*—Antonelli, Terry, Stout, & Kraus, LLP

[57] ABSTRACT

A compound semiconductor device including a MISFET and a thyristor connected in series wherein either the withstanding voltage between the MISFET p base layer and the thyristor p base layer is set lower than the withstanding voltage of the MISFET, the MISFET is turned off under a condition that the MISFET p base layer and the thyristor p base layer are connected via a p channel or the lateral resistance of the thyristor p base layer is reduced, thereby the safe operating region of the compound semiconductor device is extended.

21 Claims, 24 Drawing Sheets

COMPOUND SEMICONDUCTOR DEVICE CONTROLLED BY MIS GATE, DRIVING METHOD THEREFOR AND ELECTRIC POWER CONVERSION DEVICE USING THE COMPOUND SEMICONDUCTOR DEVICE AND THE DRIVING METHOD

BACKGROUND OF THE INVENTION

The present invention relates to a compound semiconductor device which is turn-on and off controlled by a MIS gate and has a broad safe operating region, a driving method therefor and an electrical power conversion device using the compound semiconductor device and the driving method.

Because of a demand for higher performance in electrical conversion devices, including an inverter device, it is desired to develope semiconductor switching elements having a higher switching speed, a lower power loss and a large current carrying capacity. As one of such semiconductor switching elements which meet the above demand, an element in which a thyristor is controlled by a MIS gate (MIS control thyristor) has recently attracted attention. Since such a MIS control thyristor can realize a lower turn-on voltage in comparison with an IGBT (Insulated Gate Bipolar Transistor) which is an element controlling a bipolar transistor through a MIS gate to thereby reduce the resistance loss thereof during the turn-on period and is suitable as an element which is required to have a high withstanding voltage. The MIS control thyristor, in which a MISFET is connected in series with a thyristor and the conduction and interruption of the current passage of the thyristor are switched by turning-on and off the MISFET, is unlikely to cause current concentration into one element and is effective to increase the current carrying capacity due to the current limiting function of the MISFET connected in series even if the elements are integrated and operated in parallel. Such an element is, for example, reported in a paper by N. Iwamuro et al. "A STUDY OF EST'S SHORT-CIRCUIT SOA", Proceeding of 1993 International Conference on Power Semiconductor Devices and ICs, Tokyo, pp.71–76 and JP-A-4-196359(1992) which corresponds to U.S. Pat. No. 5,357,120.

FIG. 5 shows a structure in cross section representing an example of conventional MIS control thyristors. In the instant semiconductor device, on the back face of a n−1 substrate (n−1 layer) 1, a p+ layer 2 is formed. A collector electrode (C) 3 is provided on the p+ layer 2 through a low resistance contact. On the front face of the n−1 substrate 1, an insulated gate G1 composed of a gate electrode 5 and an insulating film 6, and an insulated gate G2, composed of gate electrode 7 and an insulating film 8, are formed. A n+1 layer 11 and a n+2 layer 12 which reach to the bottom of the insulated gate G1 are formed on the main front surface of the n−1 substrate 1, while opposing each other with the insulated gate G1 being positioned therebetween. Further, a n+3 layer 13 which reaches to the bottom of the insulated gate G2 is formed on the main front surface of the n−1 substrate 1 at the opposite side of the n+2 layer 12 with respect to the insulated gate G2. A p1 layer 14 is provided so as to surround the n+1 layer 11 and the n+2 layer 12. A p2 layer 15 is similarly provided so as to surround the n+3 layer 13. An electrode 4 is provided on the n+1 layer 11 through a low resistance contact. An emitter electrode (E) 9 is formed on the n+2 layer 12 and the p1 layer 14 through a low resistance contact. An electrode 10 is provided on the n+3 layer 13 through a low resistance contact. The electrodes for the insulated gates G1 and G2 are connected via a low resistance wiring electrode. Further, the electrodes 4 and 10 are similarly connected by a separate low resistance wiring electrode.

FIG. 6 shows an equivalent circuit of the above explained compound semiconductor device. The instant device contains a thyristor (Th1) constituted by a pnp transistor (Q1) defined by the p+ layer 2, the n−1 layer 1 and the p2 layer 15 and a npn transistor (Q2) defined by the n−1 layer 11 the p2 layer 15 and the n+3 layer 13. The thyristor Th1 is connected to the emitter (E) 9 via the electrode 10, the wiring electrode, the electrode 4, the insulated gate G1 and an n channel MISFET (M2) defined by the n+1 layer 11, the p1 layer 14 and the n+2 layer 12. Further, the source and drain of an n channel MISFET (M1) defined by the n+3 layer 13, the p2 layer 15 and the n−1 layer 1 are respectively connected to the emitter and collector of the npn transistor Q2. Still further, a p channel MISFET (M3) defined by the p1 layer 14, the n−1 layer 1 and the p2 layer 15 is provided between the p1 layer 14 and the p2 layer 15.

The operating principle of the instant device will be explained with reference to FIG. 5 and FIG. 6. At first, in order to turn on the instant device, a positive voltage with respect to the emitter electrode E is applied to the collector C and the gate electrode G. Thereby, on the front faces of the p1 layer 14 and the p2 layer 15 beneath the insulated gates G1 and G2 n inverted layers are respectively formed, and the n channel MISFETs M1 and M2 are turned on. The emitter electrode E and the n−1 layer 1 are connected via the turned on n channel MISFETs M1 and M2 and electrons are injected into the n−1 layer 1. Through the electron injection the potential of the n−1 layer 1 drops and positive holes are injected from the p+ layer 2 to the n−1 layer 1 to turn on the pnp transistor Q1. The injected positive holes difuse through the n−1 layer 1 and are injected into the p2 layer 15 serving as the base layer of the npn transistor Q2 to turn on the same. As a result, the thyristor Th1 is turned on to render the instant semiconductor device in a conductive condition. Further, the current flowing through the thyristor Th1 is subjected to the current limiting action of the n channel MISFET M2 connected in series. On the other hand, when turning off the instant device, the gate electrode G is biased to the same potential or a negative potential with respect to the emitter electrode E. Thereby, the n channel MISFETs M1 and M2 are turned off and the electron injection into the n−1 layer 1 is interrupted, and so the pnp transistor Q1 and the npn transistor Q2 are turned off to render the instant semiconductor device in a non-conductive condition.

In the instant semiconductor device, in addition to the positive hole injection from the p+ layer 2, electrons are injected from the n+3 layer 13 to the n−1 layer 1 due to the thyristor operation therefore an intense conductivity modulation by the n−1 layer 1 is generated in comparison with an IGBT, and so a turn-on with a low voltage is realized. Further, in the same manner as in the IGBT, the turning on and off can be effected through voltage application to and removal from the insulated gate, therefore a similar advantage as that obtained with the conventional IGBT in that the gate circuit is extremely simplified, is also appreciated.

SUMMARY OF THE INVENTION

The present inventors noted a problem in the above explained compound semiconductor device in which a thyristor and a MISFET are connected in series in that the safe operating region thereof is extremely narrow in comparison with that of a IGBT.

An object of the present invention is to provide a MIS control type thyristor having a broad safe operating region while simultaneously retaining the advantage of a thyristor capable of being turned on at a low voltage.

Further, the present inventors have found that one of the causes of the narrow safe operating region is due to the excessive voltage application on the MISFET connected in series with the thyristor, which phenomena will be explained hereinbelow with reference to the equivalent circuit shown in FIG. 6.

The voltage VM2 applied to the MISFET (M2) connected in series and directly with the thyristor Th1 is obtained by subtracting the voltage VTh1 applied to the thyristor Th1 from the collector-emitter voltage VCE, in that VM2=VCE-VTh1. When increasing the collector-emitter voltage VCE under the turn-on condition, the collector current IC saturates and stays at substantially a constant value due to the current limiting action of the n channel MISFET M2, therefore the thyristor voltage VTh1 also assumes substantially a constant value. At this instance when the collector-emitter voltage VCE is increased, the voltage VM2 likely increases. When the collector-emitter voltage VCE is further increased, the voltage VM2 exceeds a withstanding voltage VBM2 between the drain and source of the n channel MISFET M2, and an avalanche current flows into the n channel MISFET M2 to increase the collector current IC. For this reason, in the region of a large collector-emitter voltage VCE the current limiting action of the n channel MISFET M2 disappears and an excessive current flows through the semiconductor device to thereby possibly breakdown the same. Therefore, the safe operating region thereof is narrowed.

Major features of the present invention based on the above mentioned observation are as follows.

One of the features is to lower the withstanding voltage between the source and drain of the p channel MISFET M3 below the withstanding voltage VBM2. Thereby, a safe operating region comparable to that of a IGBT is obtained. As seen from the FIG. 6 equivalent circuit, the voltage VM2 is determined by subtracting the base-emitter voltage VBEQ2 of the npn transistor Q2 from the voltage VM3 applied to the p channel MISFET M3, in that VM2=VM3-VBEQ2. Since the base-emitter voltage VBEQ2 is substantially constant, when the voltage VM2 increases due to the increase of the collector-emitter voltage VCE, the voltage VM3 increases. When the voltage VM3 increases up to the source-drain withstanding voltage VBM3, a leakage current flows through the p channel MISFET M3, the increase in the voltage VM3 is prevented, thereby the maximum value VM2max of the voltage VM2 is determined by subtracting the base-emitter voltage VBEQ2 from the source-drain withstanding voltage VBM3, in that VM2max=VBM3-VBEQ2. For this reason, if the source-drain withstanding voltage VBM3 is lowered below the source-drain withstanding voltage VBM2, the voltage VM2 falls below the voltage VBM2. Therefore, the current limiting action of the n channel MISFET is prevented and a safe operating region comparable with a IGBT is obtained.

Another feature of the present invention is to short-circuit the cathode side base layer of the thyristor to the emitter electrode prior to turning off the MISFET during the turning off operation thereof. Thereby, a potential increase of the p base layer (p2) of the thyristor is suppressed and an increase of the drain potential VD of the MISFET is suppressed as well. Accordingly, an a application of excess voltage between the source and drain of the MISFET is prevented; therefore, the current limiting action is preserved to thereby extend the safe operating region thereof.

Further, the present inventors have found another cause which narrows the safe operating region of the semiconductor device. Namely, the present inventors found that when a voltage drop which is caused by the flow of positive holes through the p base layer (p2) of the thyristor in the lateral direction during the turn-off period is increased, a part of the pn junction constituted by the p base layer (p2) and the n emitter layer exceeds its withstanding voltage to thereby fail to carry out the turn-off operation.

One of the major features of the present invention according to the above mentioned observation is to design the semiconductor device to satisfy the following condition;

$$\rho_S < V_B/(J \times L_O \times L_P)$$

wherein,

J: average current density flowing through the p base layer of the thyristor in the lateral disection, $L_P$: length of the p base layer along the current flow direction, $L_O$: length of the n type substrate along the current flow direction, $\rho S$: average sheet resistance of the p base layer, and $V_B$: withstanding voltage of pn junction formed beneath the gate by the n emitter layer and the p base layer of the thyristor. Thereby, no voltage exceeding the withstanding voltage is applied on the pn junction of the thyristor, and accordingly the safe operating region thereof is extended.

Other features and advantages of the present invention will become apparent when reading the following description.

DESCRIPTION OF THE PREFERRED EMBODIMENTS

Figure 1:
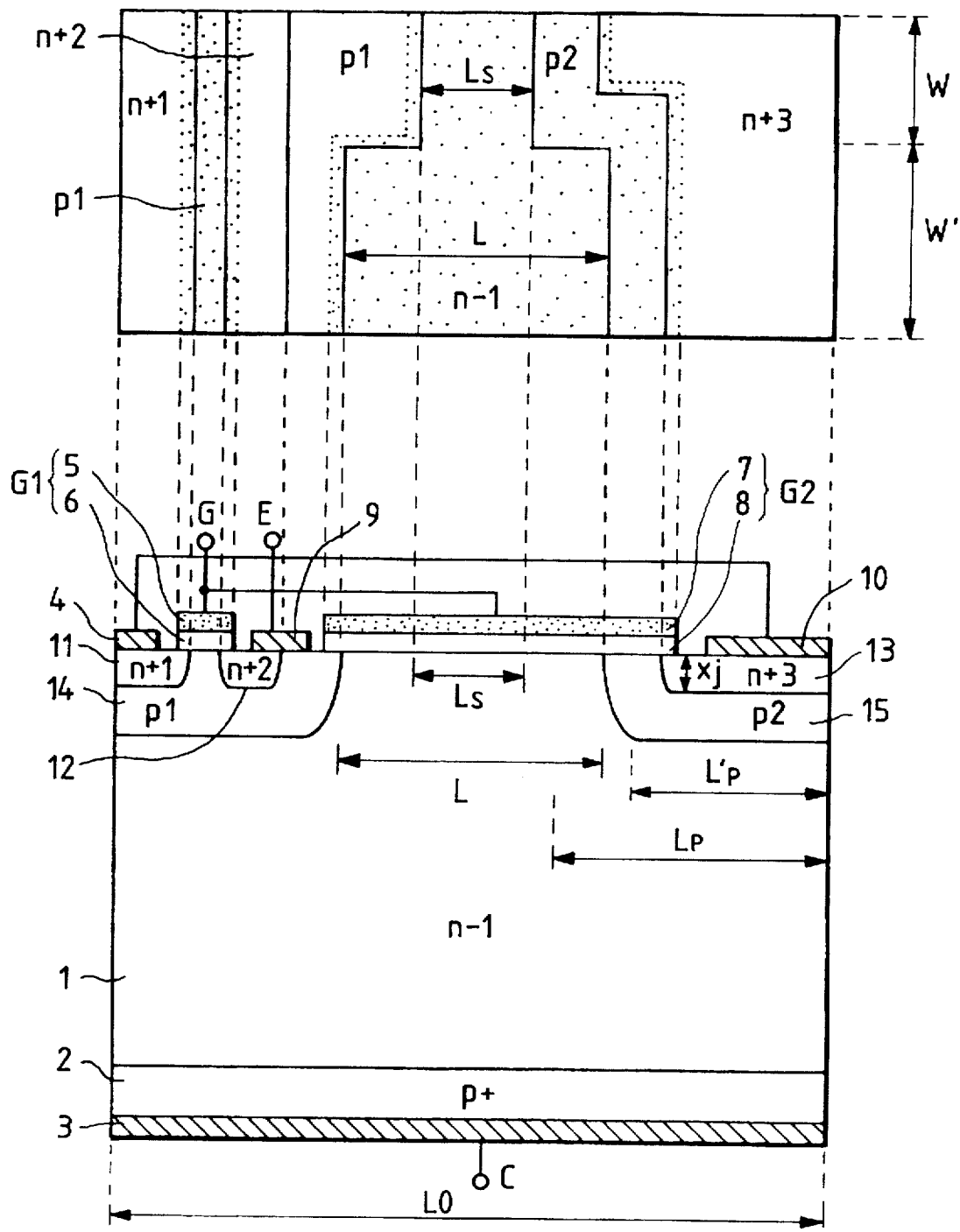
FIG. 1 is a diagram which shows cross sectioned and surface structures of one embodiment according to the present invention.

Hereinbelow, an embodiment of the present invention will be explained with reference to FIG. 1. In the semiconductor device of which cross sectioned and surface structures are illustrated in FIG. 1, a p+ layer 2 is formed on the back face of a n−1 substrate (n−1 layer) 1. A collector electrode (C) 3 is provided on the p+ layer 2 through a low resistance contact. On the front face of the n−1, substrate 1 an insulated gate G1, composed of a gate electrode 5 and an insulating film 6, and an insulated gate G2, composed of a gate electrode 7 and an insulating film 8, are formed. A n+1 layer 11 and a n+2 layer 12 which reach to the bottom of the insulated gate G1, are formed on the main front surface of the n−1 substrate 1 while opposing each other with the insulated gate G1 being disposed therebetween. Further, a n+3 layer 13 which reaches to the bottom of the insulated gate G2 is formed on the main front surface of the n−1 substrate 1 at the opposite side of the n+2 layer 12 with respect to the insulated gate G2. A p1 layer 14 is provided so as to surround the n+1 layer 11 and the n+2 layer 12. A p2 layer 15 is similarly provided so as to surround the n+3 layer 13. In the present embodiment, the p1 layer 14 and the p2 layer 15 are disposed so that each of the layers includes at least two regions wherein the spacing distances between the two layers are different. An electrode 4 is provided on the n+1 layer 11 through a low resistance contact. An emitter electrode (E) 9 is formed on the n+2 layer 12 and the p1 layer 14 through a low resistance contact. An electrode 10 is provided on the n+3 layer 13 through a low resistance contact. The electrodes for the insulated gates G1 and G2 are connected via a low resistance wiring electrode. Further, the electrodes 4 and 10 are similarly connected by a separate low resistance wiring electrode.

Figure 5:
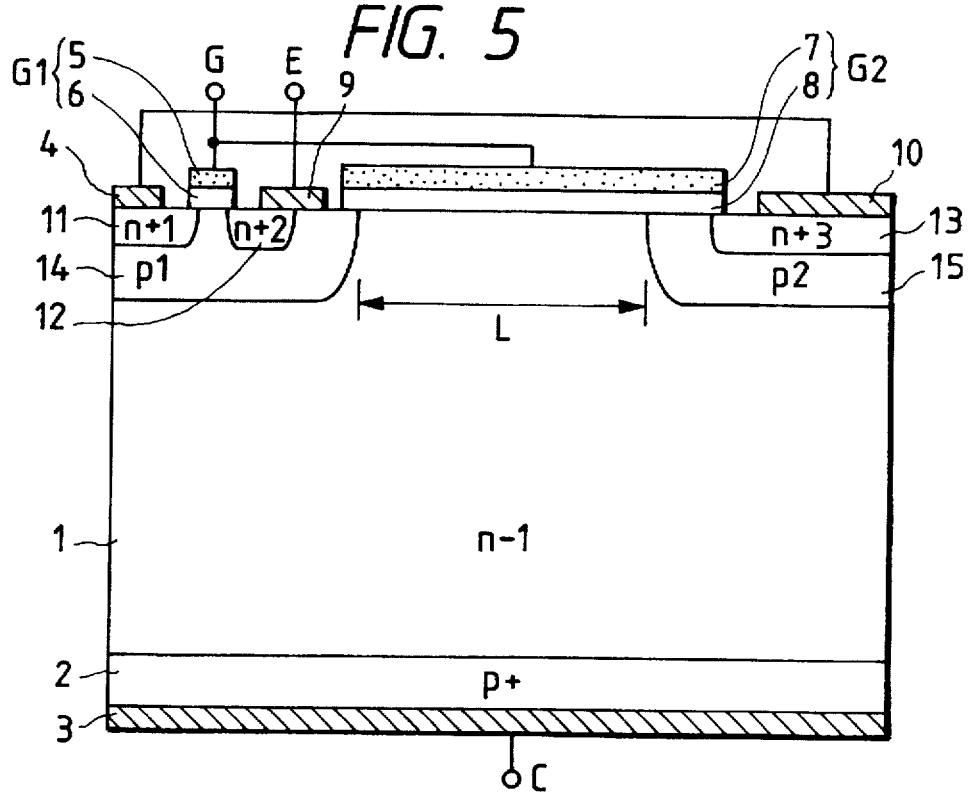
FIG. 5 is a diagram which shows a cross sectioned structure of an example of conventional MIS control thyristors.

The equivalent circuit and the operating principle of the semiconductor device of the present embodiment are identical to those of the conventional example as explained in connection with FIG. 5. In addition thereto, in the present semiconductor device there are two regions, one having a wide spacing distance (L) between the p1 layer 14 and the p2 layer 15, and the other having a narrow spacing distance (LS) therebetween. These two regions one having a wide spacing distance and the other having a narrow spacing distance between the p1 layer 14 and the p2 layer 15 can be provided when the p1 layer 14 and the p2 layer 15 are formed through a gate self aligning method using the insulating gate G2 as a mask.

The source-drain withstanding voltage VBM3 of the p channel MISFET M3 is determined by a voltage when the n−1 layer 1 in the narrow portion LS between the p1 layer 14 and the p2 layer 15 is depleted and panched through. Therefore, if the portion LS is narrowed and the source-drain withstanding voltage VBM3 is lowered below the source-drain withstanding voltage VBM2, no excess voltage is applied onto the n channel MISFET M2 and a broad safe operating region is obtained. Further, because of the provision of the region having wide spacing distance L between the p1 layer 14 and the p2 layer 15 the electron injection into the n−1 layer 1 is not disturbed. As a result, while keeping the advantages of easy turning on operation and a low resistance loss which are inherent in the thyristor having a p base layer of a floating potential, a broad safe operating region is at the same time achieved. Further, in the present embodiment, it is preferable to set the width L below 60 μm and the width LS below 30 μm.

Figure 7:
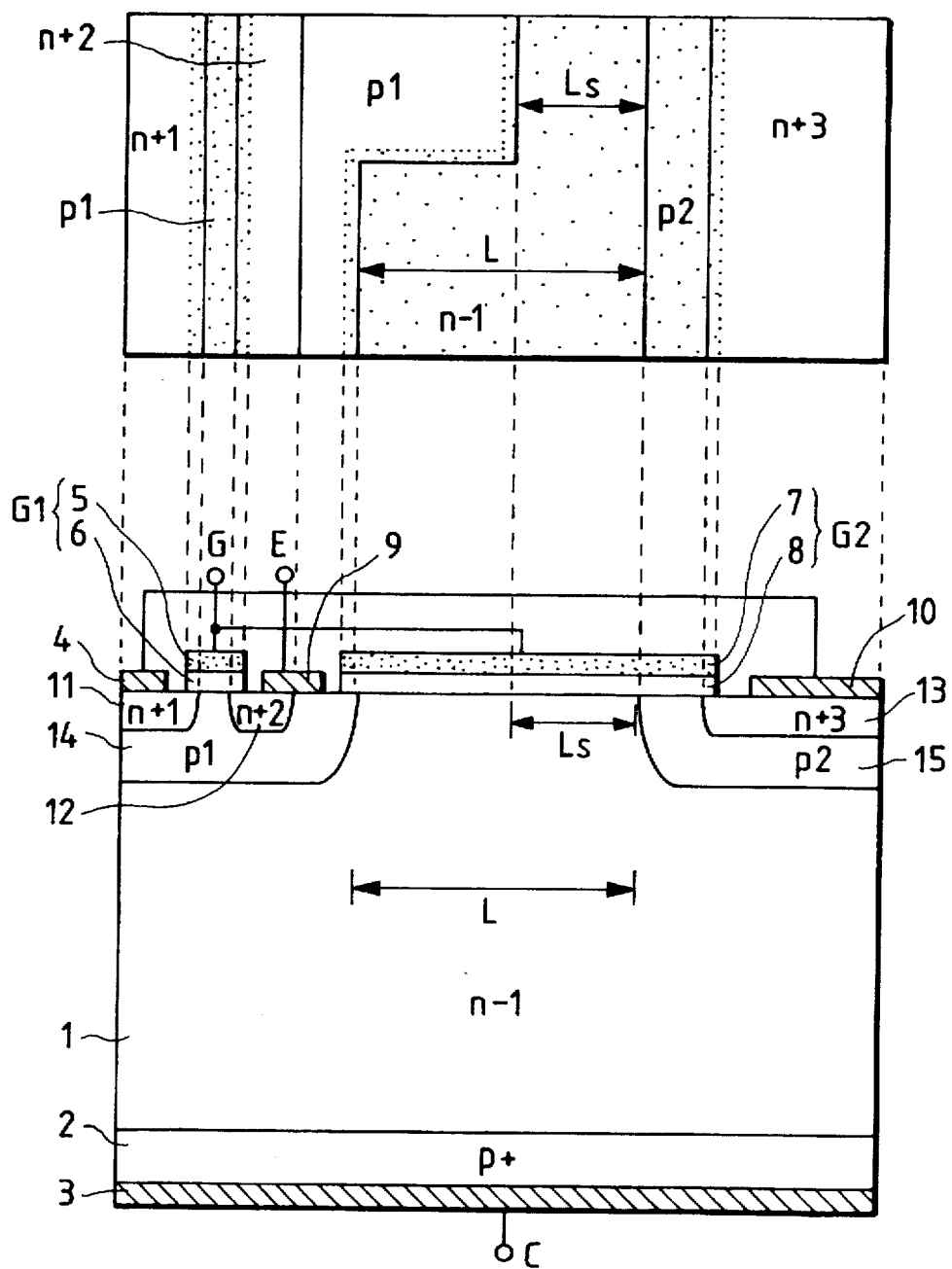
FIG. 7 is a diagram which shows cross sectioned and surface structures of another embodiment according to the present invention.

Further, in the present embodiment, the narrow portion LS between the p1 layer 14 and the D2 layer 15 is formed by causing the p1 layer 14 and the p2 layer 15 to come close to each other. However, when only the width of the p1 layer 14 is varied as in another embodiment as illustrated in FIG. 7, the configuration of the thyristor become on-uniform which hardly produces a current concentration. For this reason, FIG. 7 embodiment can control an even larger current than that in the FIG. 1 embodiment.

Figure 2:
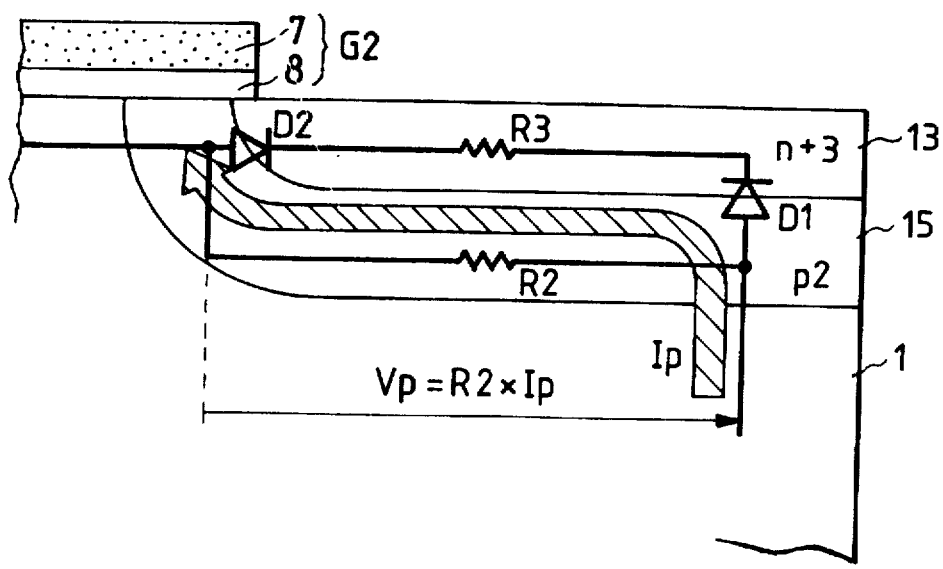
FIG. 2 is an enlarged diagrammatic view of the thyristor portion in the embodiment shown in FIG. 1.

Now, the thyristor portion in the FIG. 1 embodiment will be explained. FIG. 2 is an enlarged view of the region of the p2 layer 15 and the n+3 layer 13 in FIG. 1. In the drawing, the equivalent circuit of the region is provided in an overlapping manner. D1 is a diode constituted by the p2 layer 15 and the n+3 layer 13 at the center portion of the thyristor region, and D2 is a diode constituted by the p2 layer 15 and the n+3 layer 13 beneath the insulated gate G2 at the end of the thyristor region. Further, in the drawing, the flow route of the positive hole current flowing during the turn-off period is also illustrated. As illustrated in the drawing, during the turn-off period, the following voltage $V_p$ is applied on the diodes D1 and D2 which are connected in opposite polarity direction:

$$V_P = R2 \times I_P \quad (1)$$

therefore, the diode D1 is biased toward the forward direction and the diode D2 is biased toward reverse direction. At this moment, only a little current flows through the resistor R3, therefore the voltage drop thereacross is negligible. Further, the voltage applied to the diode D1 is small at about 0.7V. Accordingly, a substantial portion of the voltage $V_P$ is applied to the diode D2 in a reverse direction. When the reverse direction biasing voltage exceeds the reverse direction withstanding voltage of the diode D2, an avalanche occurs therein to turn on the thyristor, which disables the turn-off operation thereof.

In FIG. 1 embodiment, when the junction withstanding voltage of the pn junction formed at the corner portion, beneath the gate G2, of the $P^2$ layer 15 and the n+3 layer 13 is represented as $V_B$, the value of the junction withstanding voltage varies depending on the configuration of the junction. 0Namely, since the impurity density of the n+3 layer 13 is normally high in comparison with the impurity density of the p2 layer 15, and further, since the impurity distribution of the p2 layer 15 is gentle in comparison with that of the n+3 layer 13, the pn junction at the portion of the diode D2 can be treated as one sided step junction of n+p. Accordingly, the following equation stands:

$$V_B = V_{BO} \cdot (\eta^2 + 2.14\eta^{6/7} - (\eta^3 + 3\eta^{13/7})^{2/3}) \quad (2)$$

$$\eta = Xj/Xm$$

wherein, Xj is the junction depth of the n+3 layer 13, and Wm and $V_{BO}$ are respectively the width of the depletion layer and the reverse direction withstanding voltage, when assuming the existence of a one sided step junction of n+p under the condition that the impurity density of the n+3 layer 13 at the depth Xj and the impurity density of the p2 layer 15 are equal, and further assuming Xj=∞ (see S. M. Sze "Physics of Semiconductor Devices" 2nd Ed. John Wiley & Sons, 1981, p. 108).

When the reverse direction withstanding voltage $V_B$ is larger than the voltage drop $V_p$ which is caused by the lateral direction resistance of the p2 layer 15 and the positive hole current Ip flowing therethrough as explained in connection with FIG. 2, the turn-off failure never happens. Namely, when $$R2 \times I_p < V_B \quad (3)$$

under this condition, further assuming that the sheet resistance of the thyristor base, that is the p2 layer 15, is $\eta s$, the current density under the turn-on condition of the semiconductor device is J, the unit cell length of the semiconductor device as illustrated in FIG. 1 is $L_O$ and the length in the lateral direction of the thyristor region, in the portion where the distance between the MISFET and the thyristor is $L_S$, is $L_P$, the following formulas stand:

$$R2 = \rho_S (LP/W) I_p \leq J \times L_O \times W \quad (4)$$

When assuming a case when Ip is maximized in the formula (4), the formula (3) can be rewritten as follows:

$$\rho_S < V_B / (J \times L_O \times L_P) \quad (5)$$

Accordingly, even when the configurations of the respective pn layers and the electrode constitution are identical to those of conventional ones, if the condition defined by the formula (5) is satisfied, the reverse direction withstanding voltage $V_B$ at the pn junction constituted by the n emitter layer, i.e. the n+3 layer 13 and the p base layer, i.e. the p2 layer 15 exceeds the potential difference $V_P$ between the pn junction caused by the voltage drop due to the current flowing through the p base layer during the turn off period of the semiconductor device, and so no turn-off failure occurs and proper switching of the semiconductor device can be achieved.

Figure 3:
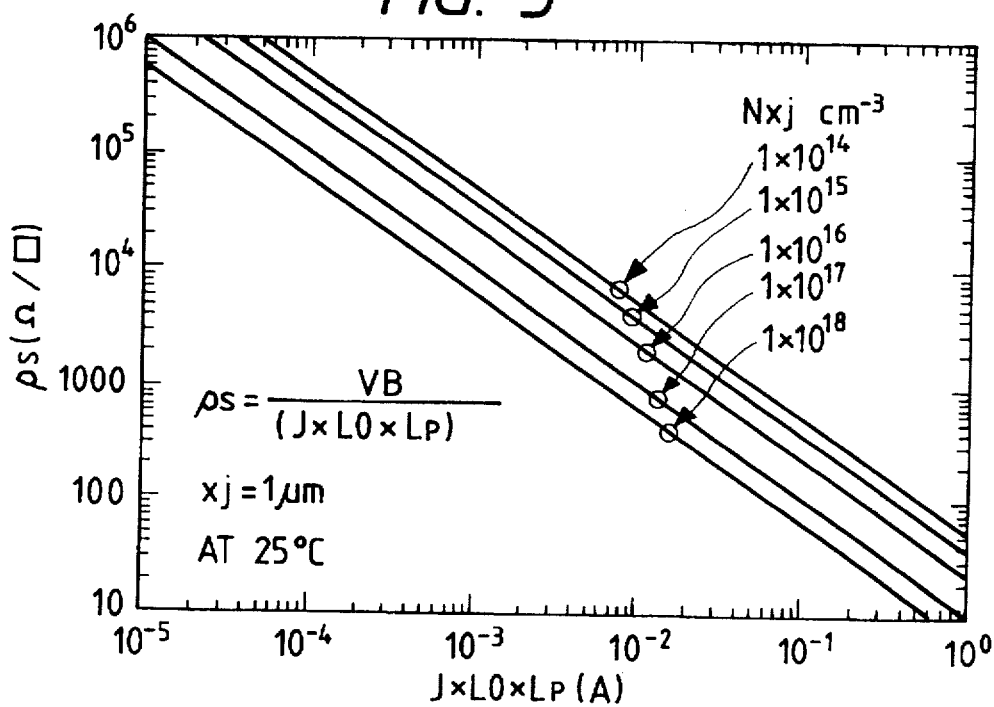
FIG. 3 is a graph which shows a relation between size and sheet resistance of a compound semiconductor device when using the impurity density thereof as a parameter.
Figure 4:
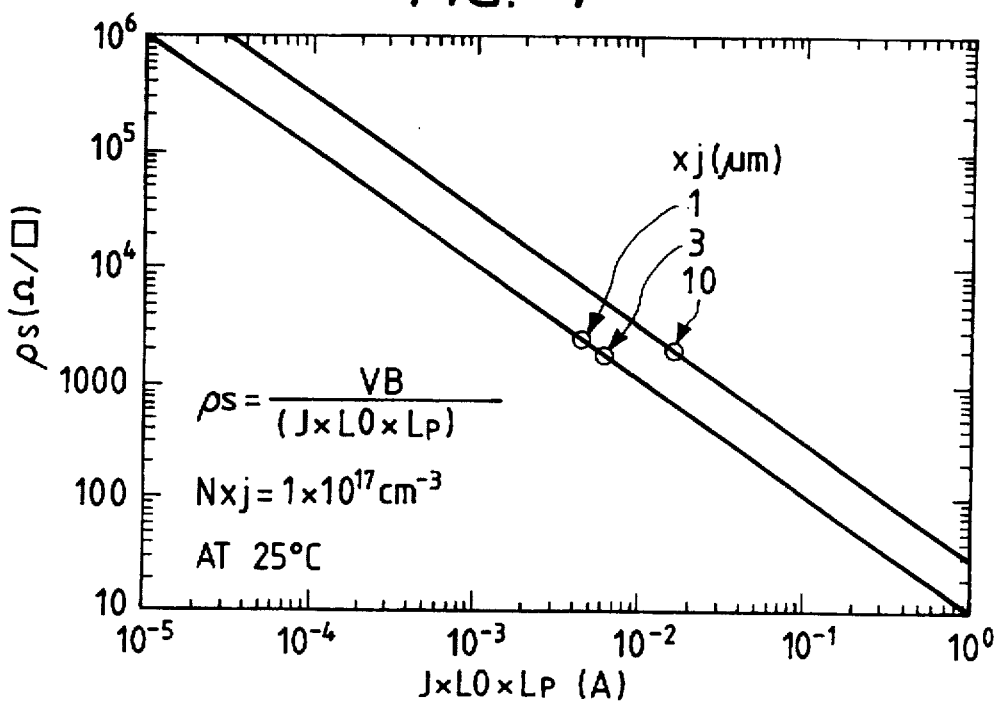
FIG. 4 is a graph showing a relation between size and sheet resistance of a compound semiconductor device when using the junction depth thereof as a parameter.

As one typical example, a relation which results when the formula (5) is expressed with equality is illustrated in FIG. 3 under the condition Xj=1 μm and using the impurity density NX; of the n+3 layer at the depth of Xj as a parameter. Further another relation which results when the formula (5) is expressed with equality is illustrated in FIG. 4 under the condition NXj=1×10$^{17}$cm$^{-3}$ and using the depth Xj in the n+3 layer as a parameter. In both Figs. the lower sides of the respective straight lines satisfy the relations expressed by the formula (5). One of the examples which satisfies the above condition is $\rho_S$<10,000 (Ω/□), when J=50A/cm$^2$, $L_O$=60 μm, $L_P$=35 μm, Xj=1 μm and NXj=1×10$^{17}$cm$^{-3}$. In this instance, when it is assumed that the present semiconductor device is, for example, applied to an inverter circuit, for example, and that the increase of the control current caused by a jumping up of a power source voltage is less than 100A/cm$^2$, it is appropriate to determine $\rho_S$=5000 (Ω/□)

Further, it is preferable to satisfy the relation defined by the formula (5) for the portion where the distance between the MISFET and the thyristor is L, in other words, the portion where the length in the lateral direction in the thyristor region is $L_P$', i.e. a width W'.

Figure 8:
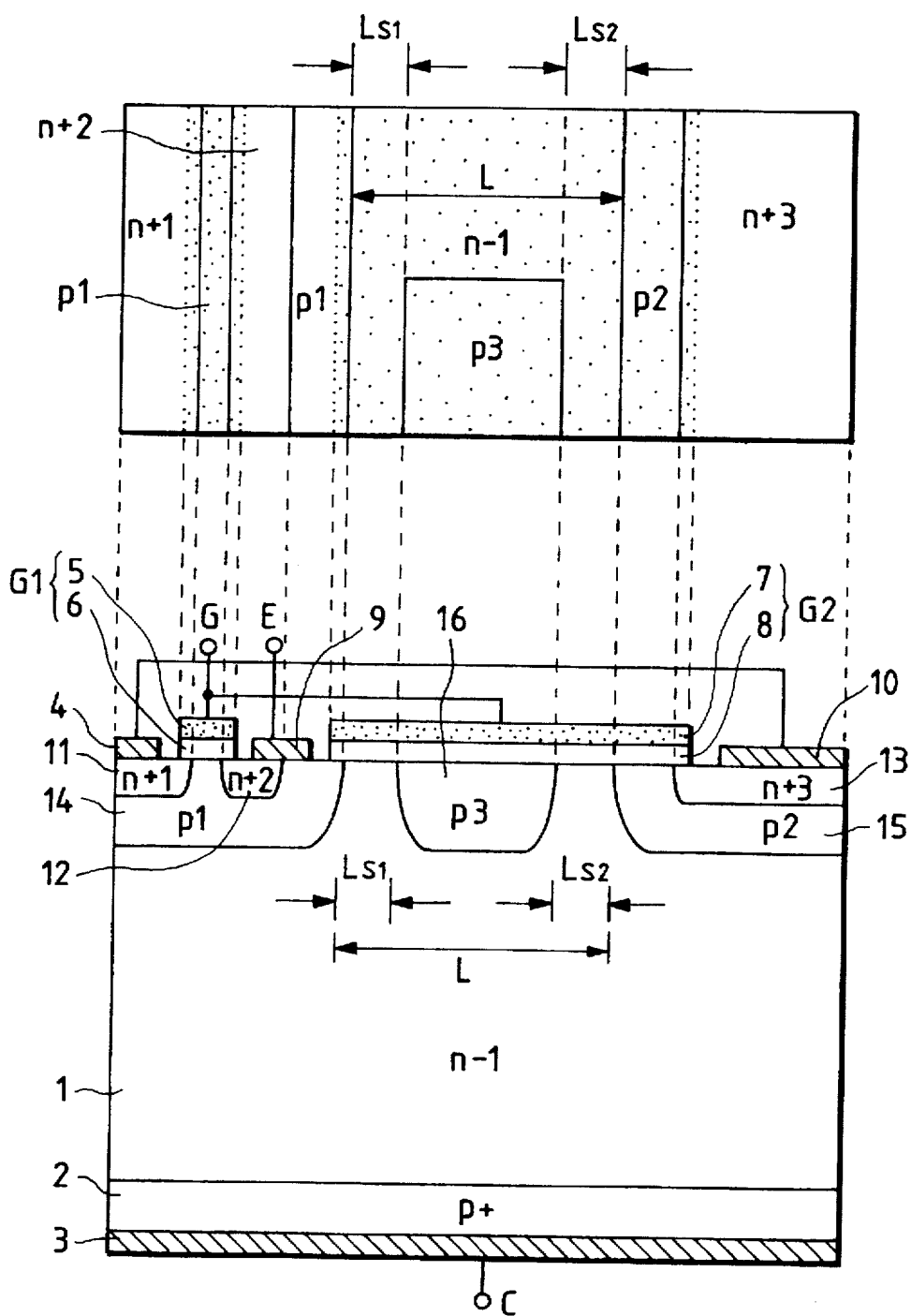
FIG. 8 is a diagram which shows cross sectioned and surface structures of still another embodiment according to the present invention in which a p type semiconductor layer is provided between a thyristor and a MISFET.

Still another embodiment of the present invention will be explained with reference to FIG. 8. In the semiconductor device, of which cross sectioned and surface structures are illustrated in FIG. 8, a p+ layer 2 is formed on the back face of a n−1 substrate (−1 layer) 1. A collector electrode (C) 3 is provided on the p+ layer 2 through a low resistance contact. On the front face of the n−1 substrate 1 an insulated gate G1 composed of a gate electrode 5 and an insulating film 6, and an insulated gate G2 composed of a gate electrode 7 and an insulating film 8 are formed. A n+1 layer 11 and a n+2 layer 12, which reach to the bottom of the insulated gate G1, are formed on the main front surface of the n−1 substrate 1 while opposing each other with the insulated gate G1 being disposed therebetween. Further, a n+3 layer 13 which reaches to the bottom of the insulated gate G2, is formed on the main front surface of the n−1 substrate 1 at the opposite side of the n+2 layer 12 with respect to the insulated gate G2. A p1 layer 14 is provided so as to surround the n+1 layer 11 and the n+2 layer 12. A p2 layer 15 is similarly provided so as to surround the n+3 layer 13. A p3 layer 16 is provided at least on a part of the major surface between the p1 layer 14 and the p2 layer 15 such that at least a part of the exposed surface of the n−1 layer 1 on the major surface between the p1 layer 14 and the p2 layer 15 is limited. An electrode 4 is provided on the n+1 layer 11 through a low resistance contact. An emitter electrode (E) 9 is formed on the n+2 layer 12 and the p1 layer 14 through a low resistance contact. An electrode 10 is provided on the n+3 layer 13 through a low resistance contact. The electrodes for the insulated gates G1 and G2 are connected via a low resistance wiring electrode. Further, the electrodes 4 and 10 are similarly connected by a separate low resistance wiring electrode.

Figure 6:
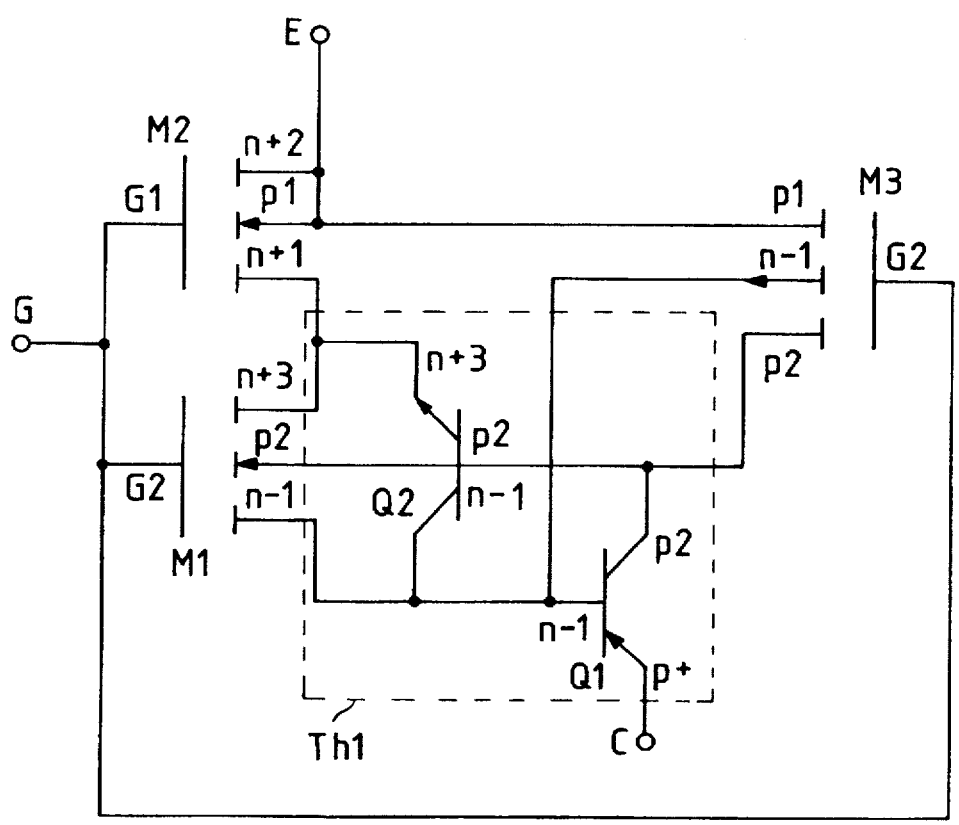
FIG. 6 is an equivalent circuit diagram of the conventional MIS control thyristor shown in FIG. 5.

A difference between the equivalent circuit of the present semiconductor device and the equivalent circuit as shown in FIG. 6 is that a series connection of a p channel MISFET M4 defined by the p1 layer 14, the n−1 layer 1 and p3 layer 16 and a p channel MISFET M5 defined by the p3 layer 16, the n−1 layer 1 and the p2 layer 15 is connected in parallel with the p channel MISFET M3. The operating principle of the present embodiment is identical with that of the conventional device as shown in FIG. 5. The source-drain withstanding voltage VBM3 of the present semiconductor device is determined by adding a voltage, when a portion in the n−1 layer 1 corresponding to the width $L_{S1}$ between the p1 layer 14 and the p3 layer 16 is depleted, and a voltage, when another portion in the width $L_{S2}$ between the p3 layer 16 and the p2 layer 15 is depleted. Therefore, if the widths $L_{S1}$ and $L_{S2}$ are sufficiently reduced, the source-drain withstanding voltage VBM3 can be lowered below the source-drain withstanding voltage VBM2. Thereby, in the present embodiment, like the embodiment shown in FIG. 1, no excess voltage is applied onto the n channel MISFET M2 and a broad safe operating region is obtained. Further, because of the provision of the region having the wide spacing distance L between the p1 layer 14 and the p2 layer 15, the electron injection into the n−1 layer 1 is not disturbed. As a result, while keeping the advantages of easy turning on operation and a low resistance loss which are inherent in the thyristor having a p base layer of a floating potential, a broad safe operating region is realized at the same time. Further, in the present embodiment, under turn-on condition where the current is still unsaturated the p3 layer 16 is at a floating potential. For this reason, the extraction of holes from the p1 layer 15 is limited in comparison with that in the FIG. 1 embodiment therefore, the positive hole density in the n−1 layer 1 is increased to thereby further reduce the resistance loss.

Figure 9:
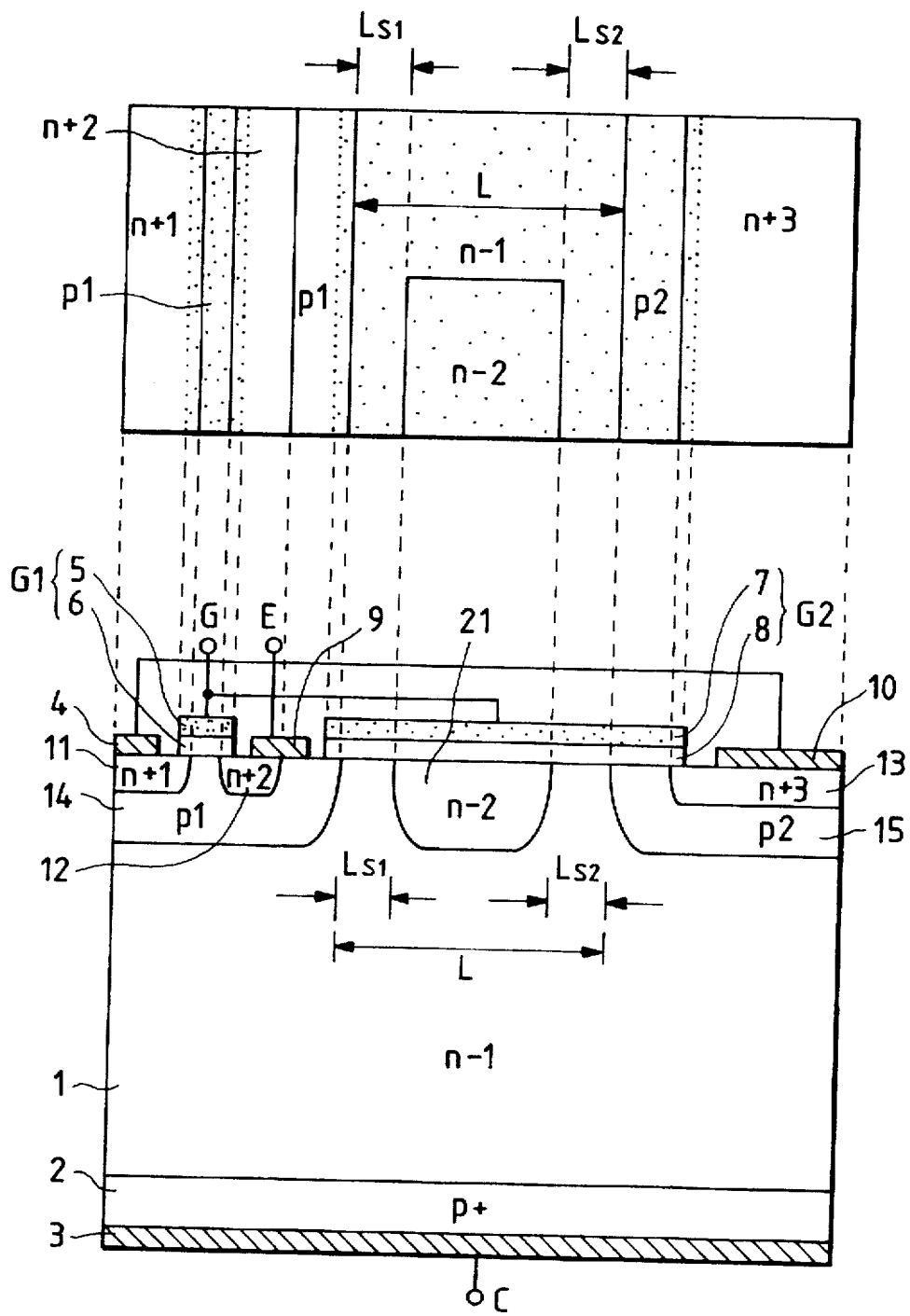
FIG. 9 is a diagram which shows cross sectioned and surface structures of a further embodiment according to the present invention in which an n type semiconductor layer is provided between a thyristor and a MISFET.

A further embodiment of the present invention is shown in FIG. 9. In the present semiconductor device, in place of the p3 layer 16 in the semiconductor device shown in FIG. 8, a n−2 layer 21 having a lower carrier density than that in the n−1 layer 1 is provided. With the provision of the n−2 layer 21, a voltage for depleting the n layer between the p1 layer 14 and the p2 layer 15 is decreased, so that the source-drain withstanding voltage VBM3 can be reduced below the source-drain withstanding voltage VBM2. For this reason, substantially the same advantages as obtained in the FIG. 8 embodiment are obtained. The n−2 layer 21 can be formed so as to cross the p1 layer 14 and the p2 layer 15, and as a result, the voltage for depleting is further reduced.

Figure 10:
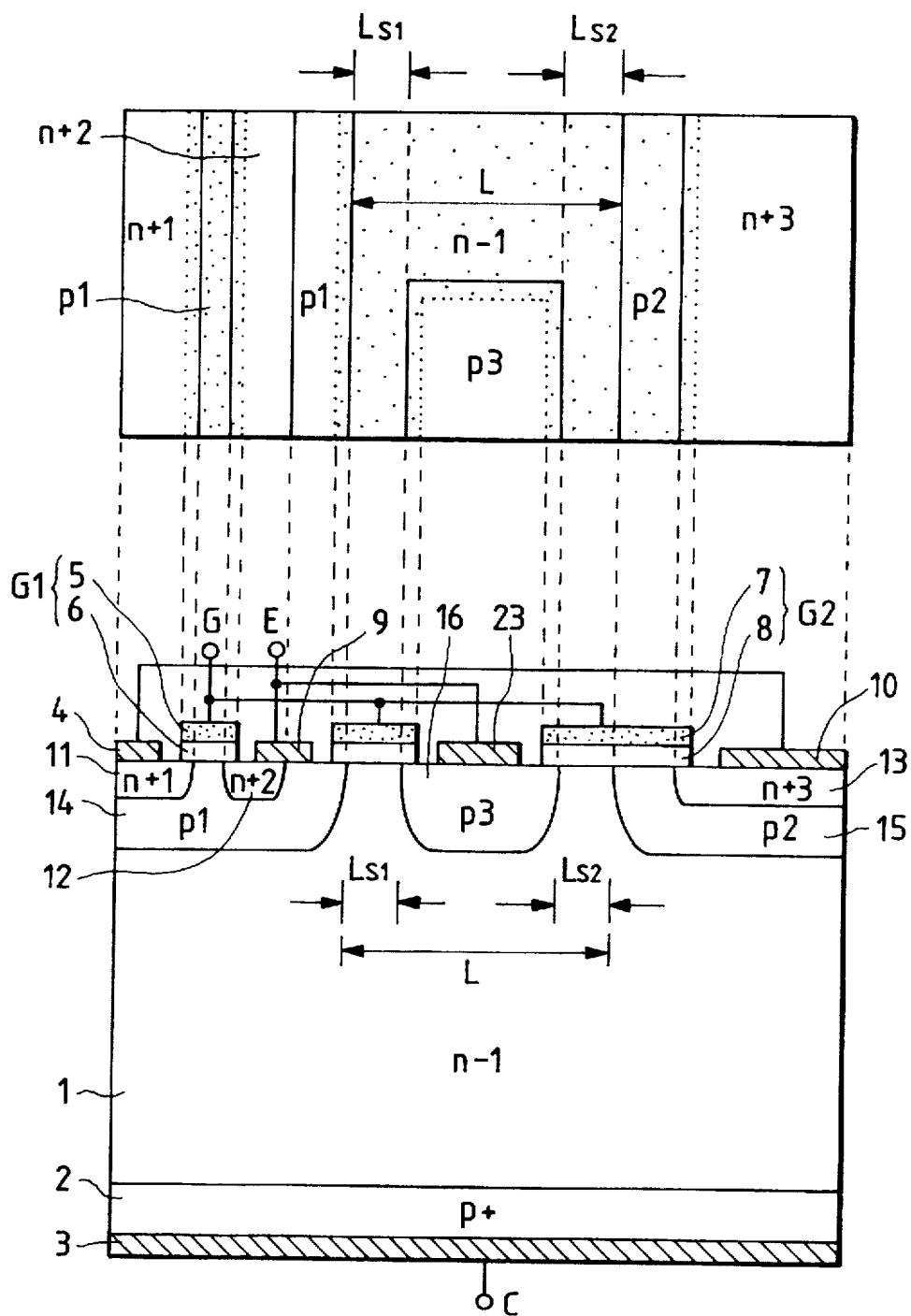
FIG. 10 is a diagram which shows cross sectioned and surface structures of a still further embodiment according to the present invention in which a p type semiconductor layer contacting an emitter electrode is provided between a thyristor and a MISFET.

A still further embodiment of the present invention is shown in FIG. 10. In the present semiconductor device, of which cross sectioned and surface structures are illustrated in FIG. 10, an electrode 23 is provided which is connected through a low resistance contact to the p3 layer 16 of floating potential, as explained in connection with the FIG. 8 embodiment, and is connected to the emitter electrode E via a low resistance wire. In the present semiconductor device, the source-drain withstanding voltage VBM3 is determined by a voltage, when a portion in the n−1 layer 1 corresponding to the width $L_{S2}$ between the p3 layer 16 and the p2 layer 15 is depleted, and therefore, if the width $L_{S2}$ is reduced, the source-drain withstanding voltage VBM3 can be reduced less than the source-drain withstanding voltage VBM2. Thereby in the present embodiment like the embodiment as shown in FIG. 1, no excess voltage is applied onto the n channel MISFET M2 and a broad safe operating region is obtained. Further, because of the provision of the region having the wide spacing distance L between the p1 layer 14 and the p2 layer 15, the electron injection into the n−1 layer 1 is not disturbed. As a result, while keeping the advantages of an easy turning on operation and a low resistance loss which are inherent in the thyristor having a p base layer of a floating potential, a broad safe operating region is obtained at the same time.

Figure 11:
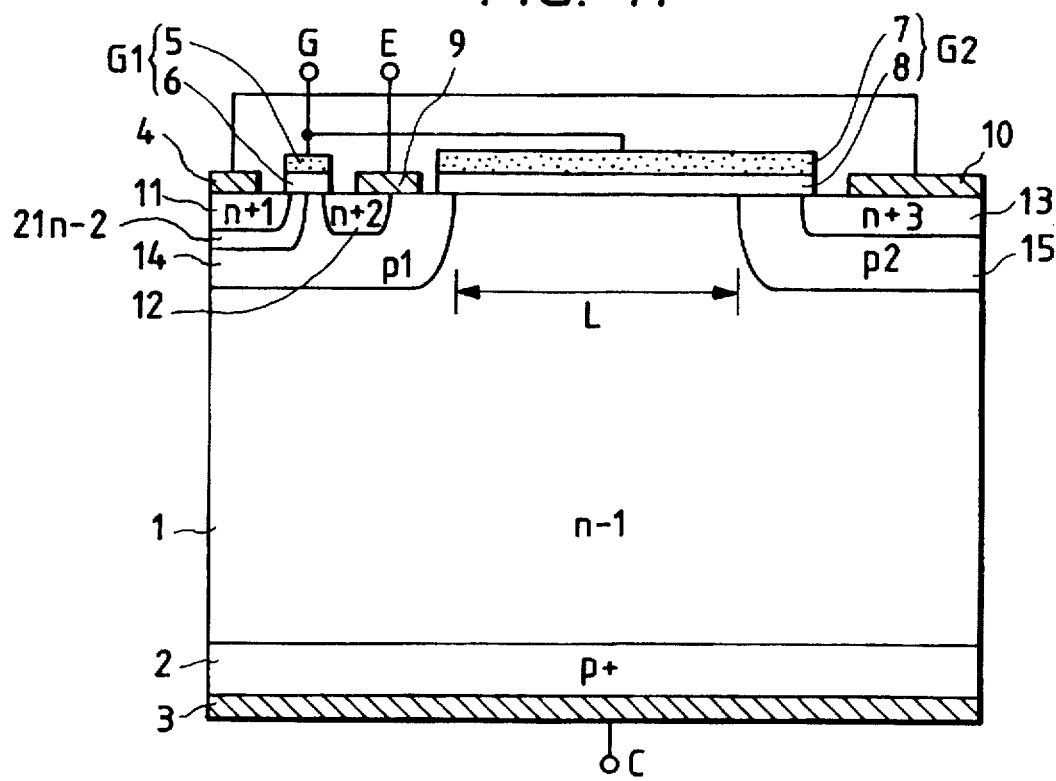
FIG. 11 is a diagram which shows a cross sectioned structure of a still further embodiment according to the present invention in which an n type semiconductor layer having a low impurity density is provided in a MISFET portion.

A still further embodiment of the present invention is shown in FIG. 11. A difference between the present semiconductor device and the conventional example as shown in FIG. 5 is that a n−2 layer 21 having a lower carrier density than that in the n+1 layer 11 is provided between the n+1 layer 11 serving as the drain layer for the MISFET and the p1 layer 14. Thereby, the source-drain withstanding voltage VBM2 is increased and exceeds the source-drain withstanding voltage VBM3. Further, since the channel length L of the p channel MISFET M3 is unchanged, the electron injection into the n−1 layer 1 is not disturbed. As a result, while keeping the advantages of an easy turning on operation and a now resistance loss, which are inherent in the thyristor having a p base layer of a floating potential, a broad safe operating region is obtained at the same time.

Figure 12:
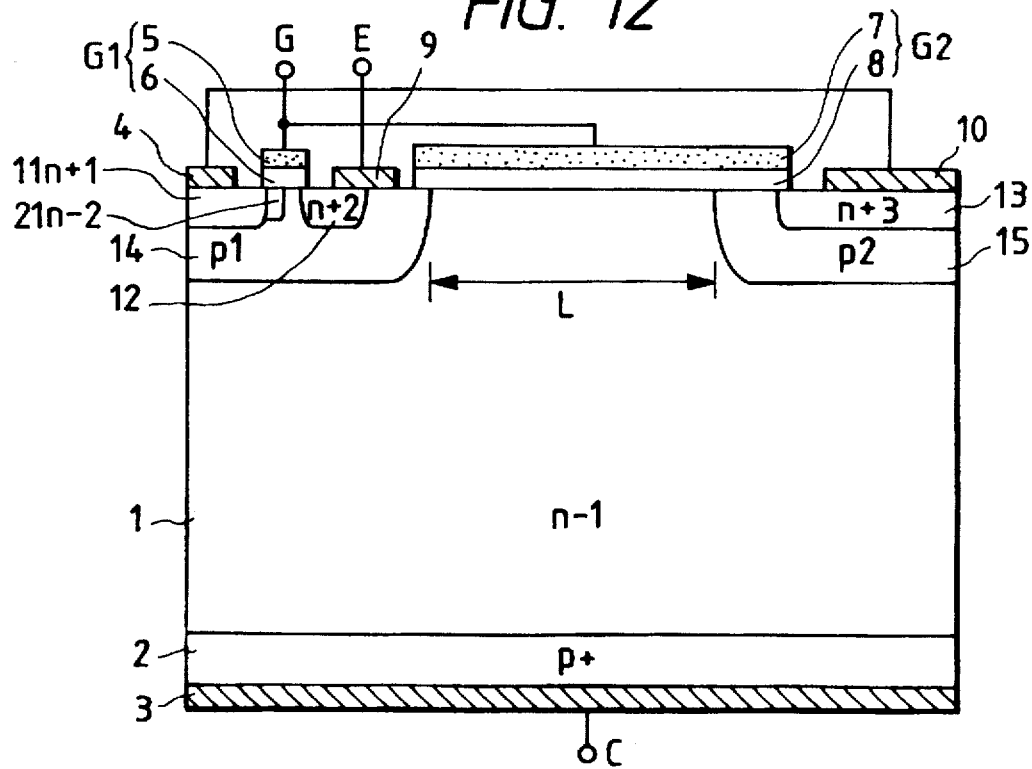
FIG. 12 is a diagram which shows a cross sectioned structure of a still further embodiment according to the present invention in which an n type semiconductor layer having a low impurity density is provided only beneath a gate in a MISFET portion.

Still another embodiment of the present invention is shown in FIG. 12. A different between the present semiconductor device and the FIG. 11 embodiment is that the n−2 layer 21 is provided only beneath the gate of the MISFET. In the present embodiment, the source-drain drain withstanding voltage VBM2 is similarly increased and exceeds the source-drain withstanding voltage VBM3. Therefore, the same advantages as obtained in the FIG. 11 embodiment are similarly obtained.

Figure 13:
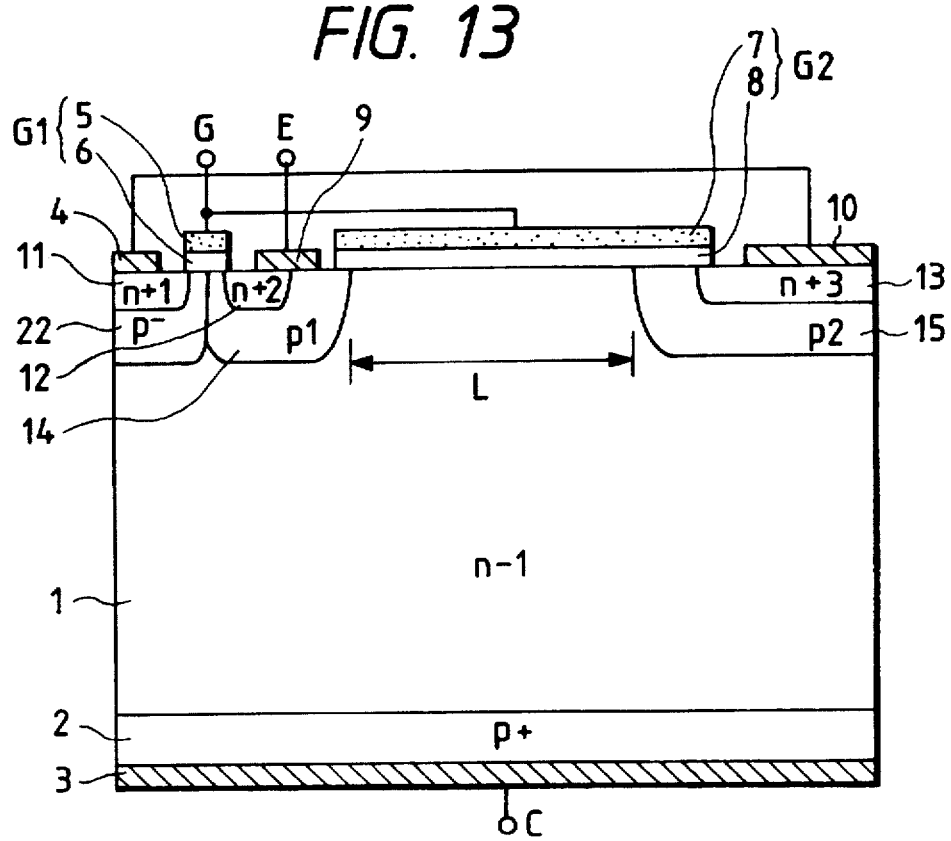
FIG. 13 is a diagram which shows a cross sectioned structure of a still further embodiment according to the present invention in which a p type semiconductor layer having a low impurity density is provided in a MISFET portion.

A still further embodiment of the present invention is shown in FIG. 13. The difference between the present semiconductor device and the FIG. 11 embodiment is that in place of the n−2 layer 21, a p− layer 22 having a lower carrier density than that in the p1 player 14 is provided. In the present embodiment, the source-drain withstanding voltage VBM2 is similarly increased and exceeds the source-drain withstanding voltage VBM3. Therefore, the same advantages as obtained in the FIG. 11 embodiment are similarly obtained.

Figure 14:
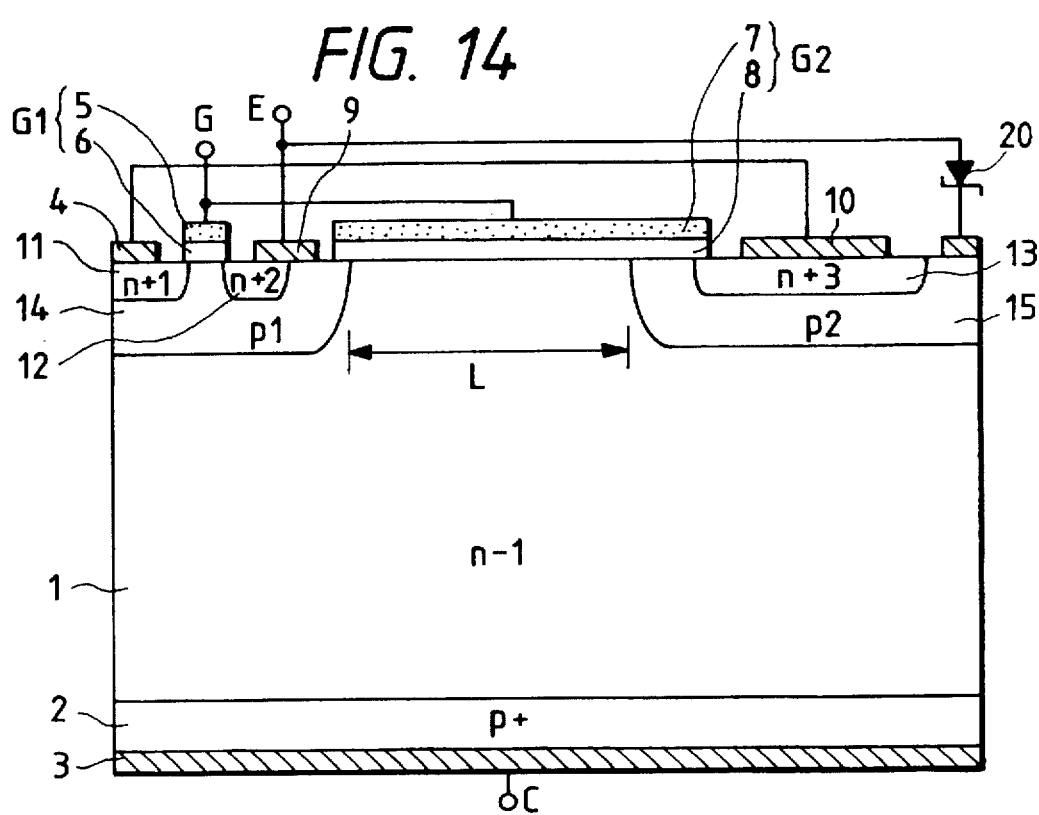
FIG. 14 is a diagram which shows a cross sectioned structure of a still further embodiment according to the present invention in which a zenor diode is connected between a p base layer and an emitter electrode of a thyristor.

A still further embodiment of the present invention is shown in FIG. 14. The difference between the present semiconductor device and the FIG. 5 conventional example is that a zenor diode D20, having a lower zenor voltage than the source-drain withstanding voltage, is provided in the thyristor p base layer and between the thyristor p base layer and the emitter electrode while directing toward the cathode electrode. Therefore, in the present semiconductor device the source-drain withstanding voltage VBM3 assumes the zenor voltage, so that no voltage more than the source-drain withstanding voltage VBM2 is applied to the n channel MISFET M2. Further, since the channel length L of the p channel MISFET M3 is unchanged, the electron injection into the n−1 layer 1 is not disturbed. As a result, while keeping the advantages of easy turning on operation and a low resistance loss, which are inherent in the thyristor having a p base layer of a floating potential, a broad safe operating region is obtained at the same time. The zenor diode can be, for example, integrally formed at the same time by making use of a polycrystalline silicon generally used for forming the insulated gate G2.

Figure 15:
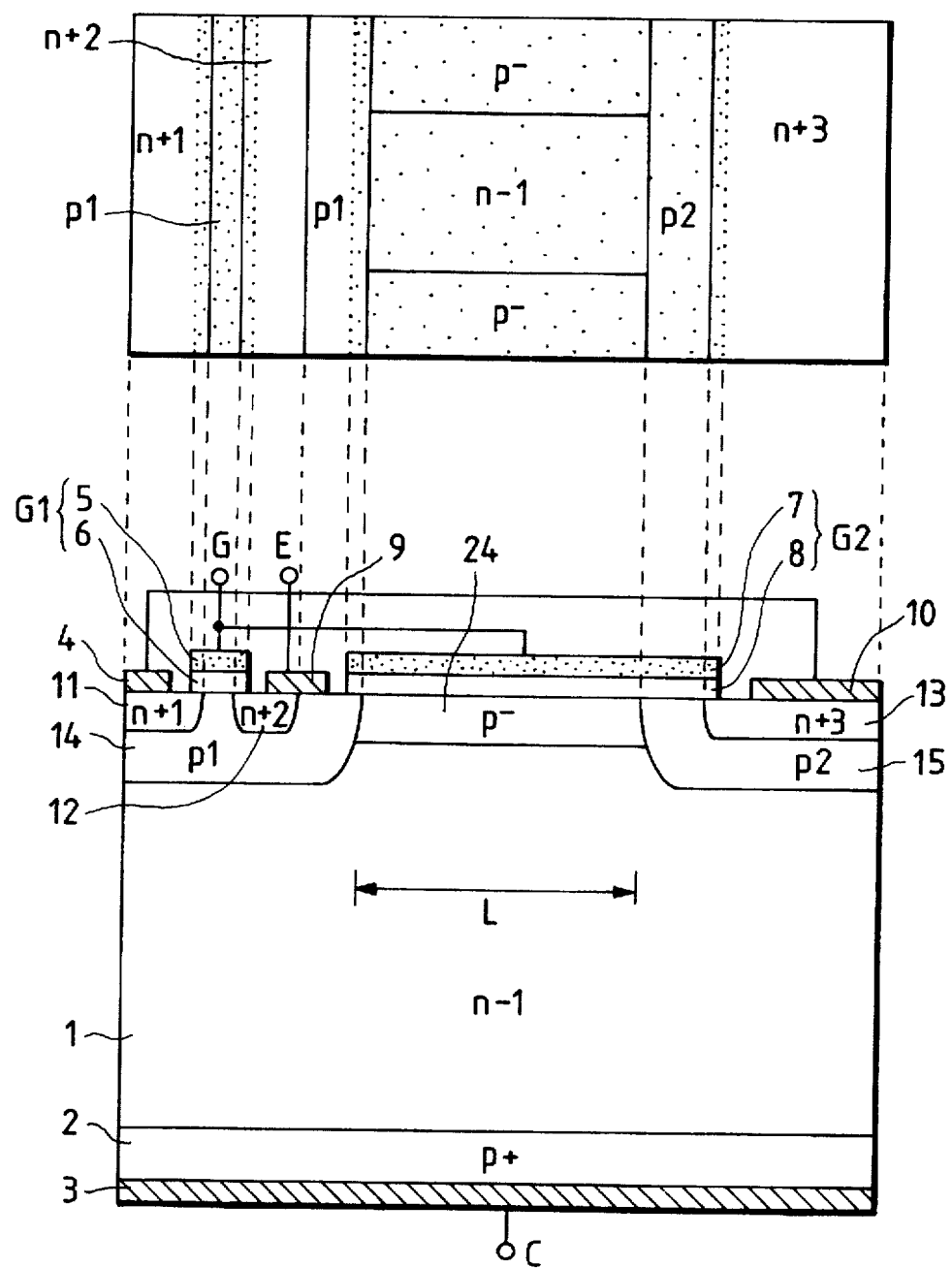
FIG. 15 is a diagram which shows cross sectioned and surface structures of a still further embodiment according to the present invention in which a p type semiconductor layer is provided between a thyristor and a MISFET so as to contact both.

A still further embodiment of the present invention is shown in FIG. 15. The difference between the present semiconductor device and the FIG. 5 conventional device is that a p− layer 24 having a low carrier density is provided at least in a part between the thyristor p base layer and the p1 layer 14 in such a manner that the p− layer 24 contacts respectively the thyristor p base layer and the p1 player 14 and is exposed on the major surface of the device. The sheet carrier density of the p− layer 24 is determined at a minimum density which prevents the p− layer 24 from being completely depleted under the entire operating condition and is preferably less than $1 \times 10^{13} cm^{-2}$ as one typical. In the present semiconductor device, since the thyristor p base layer and the emitter electrode are connected via the p− layer 24, the potential of the thyristor p base layer is lowered, which is equivalent in effect to a reduction in the source-drain withstanding voltage VBM3. Therefore, even if the source-drain withstanding voltage VBM2 is lowered, a voltage more than the withstanding voltage VBM2 is hardly applied, thereby the safe operating region is extended. At this instance, although the thyristor p base layer is short-circuited with the emitter electrode via the p type layer of low carrier density, the resistance of the p type layer is high, thus the resistance between the p base layer and the emitter electrode is kept at a high level. Namely, the p base layer is substantially kept in a floating condition. As a result, while keeping the advantages of a easy turning on operation and a low resistance loss which are in herent to the thyristor having a p base layer of a floating potential, a broad safe operating region is obtained at the same time.

Figure 16:
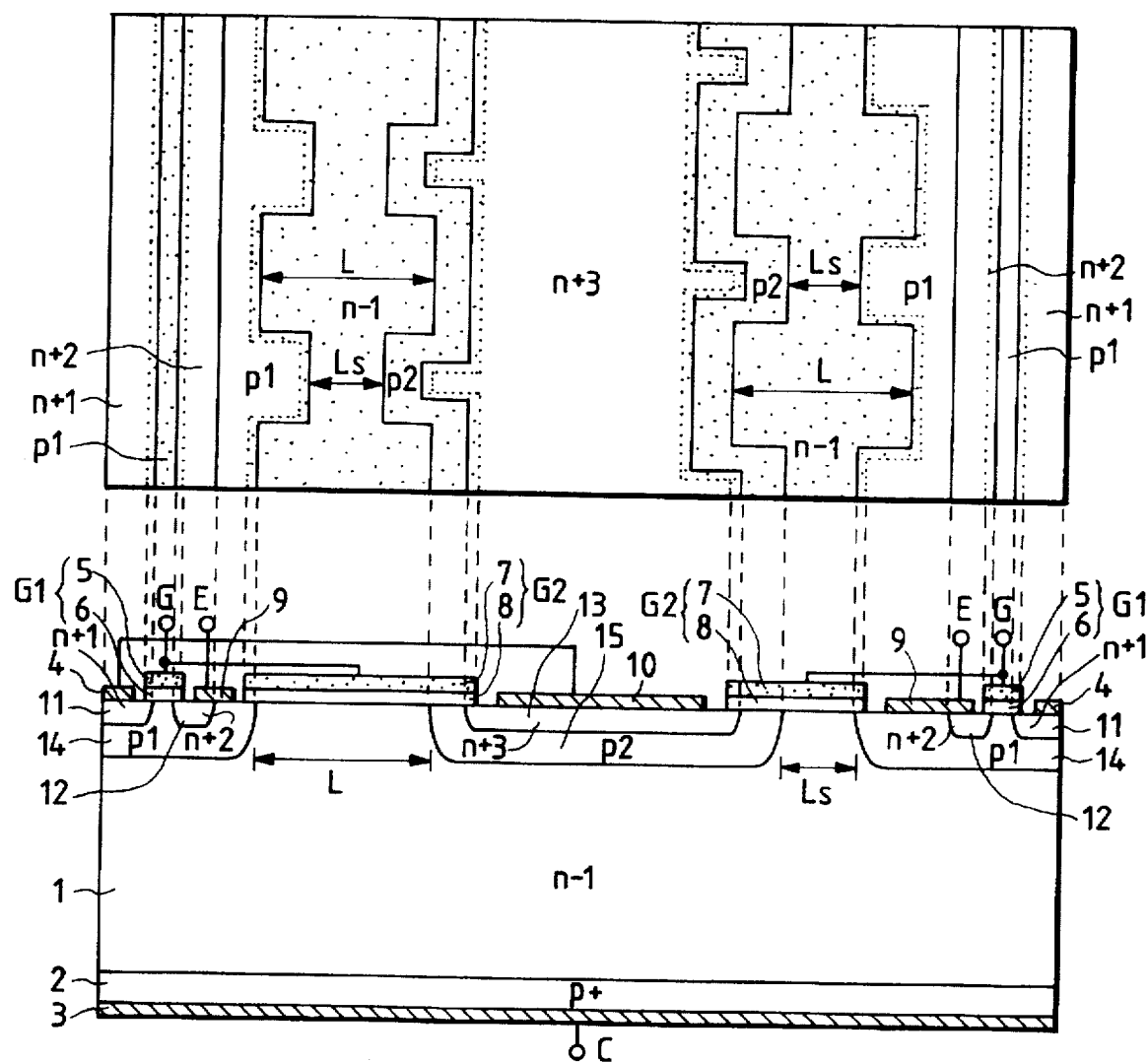
FIG. 16 is a diagram which shows cross sectioned and surface structures of a compound semiconductor device according to the present invention which is constituted by integrating a plurality of the unit elements as shown in FIG. 1.

FIG. 16 shows an embodiment in which a plurality of semiconductor elements as shown in the FIG. 1 embodiment are integrated, and represents cross sectioned and surface structures of the present semiconductor device. In the present embodiment, the broad interval regions (L) and the narrow interval regions ($L_S$) between the p1 layer 14 and the p2 layer 15 are alternatively provided over the major surface thereof, both in the direction from the p1 layer 14 to the p2 layer 15 and in the direction perpendicular thereto. Thereby, the electron injection into the n−1 layer 1 is uniformalized and the elements operate uniformly over the entire major surface of the device accordingly, break-down of the semiconductor elements due to current concentration is prevented, and thus a larger current than that permitted for the conventional elements can be controlled with the present embodiment without breaking down the present semiconductor device. In an actual semiconductor device, about 1000–100,000 pieces of the semiconductor elements, as illustrated in the preceeding embodiments, are integrated to form a semiconductor device. Further, the respective gate electrodes and emitter electrodes in the present semiconductor device are not independent and are connected to each other in another region thereof (not shown).

Hereinabove, several types of structures of the semiconductor devices, in which with the use of the withstanding voltages of the p1 layer 14 and the p2 layer 15, the withstanding voltages of the n+2 layer 12 and the n+1 layer 11 are increased, will be explained; however, it is important to note the application voltage on the n+1 layer 11 and the electrode 5 for the insulated gate G1. Namely, during the turn-off period, the gate potential varies toward the negative direction with respect to the emitter potential on the other hand, the potential of the n+1 layer 11 varies toward the positive direction due to the increase of the collector potential. Therefore, an over voltage is applied on the gate insulating film 6 and likely causes a dielectric break down thereof. Accordingly, together with the increase of the withstanding voltages of the n+2 layer 12 and the n+1 layer 11 by making use of the withstanding voltages of the p1 layer 14 and the p2 layer 15, the potential of the n+1 layer 11 has to be reduced by lowering the withstanding voltages of the p1 layer 14 and the p2 layer 15 so that the voltage applied between the n+1 layer 11 and the gate electrode 5 does not exceed the dielectric break down voltage thereof. It is preferable to select the withstanding voltages for the p1 layer 14 and the p2 layer 15 which are less than ½ of the dielectric break down voltage of the n+1 layer 11 and the gate electrode 5 in view of the reliability of the insulating film 6.

In the above embodiments, vertical type compound semiconductor devices are explained, however, the present invention is applicable to lateral type compound semiconductor devices as well. Further, in accordance with the present invention, a plurality of structures as illustrated in the respective embodiments can be combined in parallel. Still further, the conductivity types of the respective semiconductor layers in the respective embodiments as illustrated can be converted, namely from p type to n type.

Now, a driving method according to the present invention and a MIS control thyristor to which the driving method is applied will be explained.

Figure 17A:
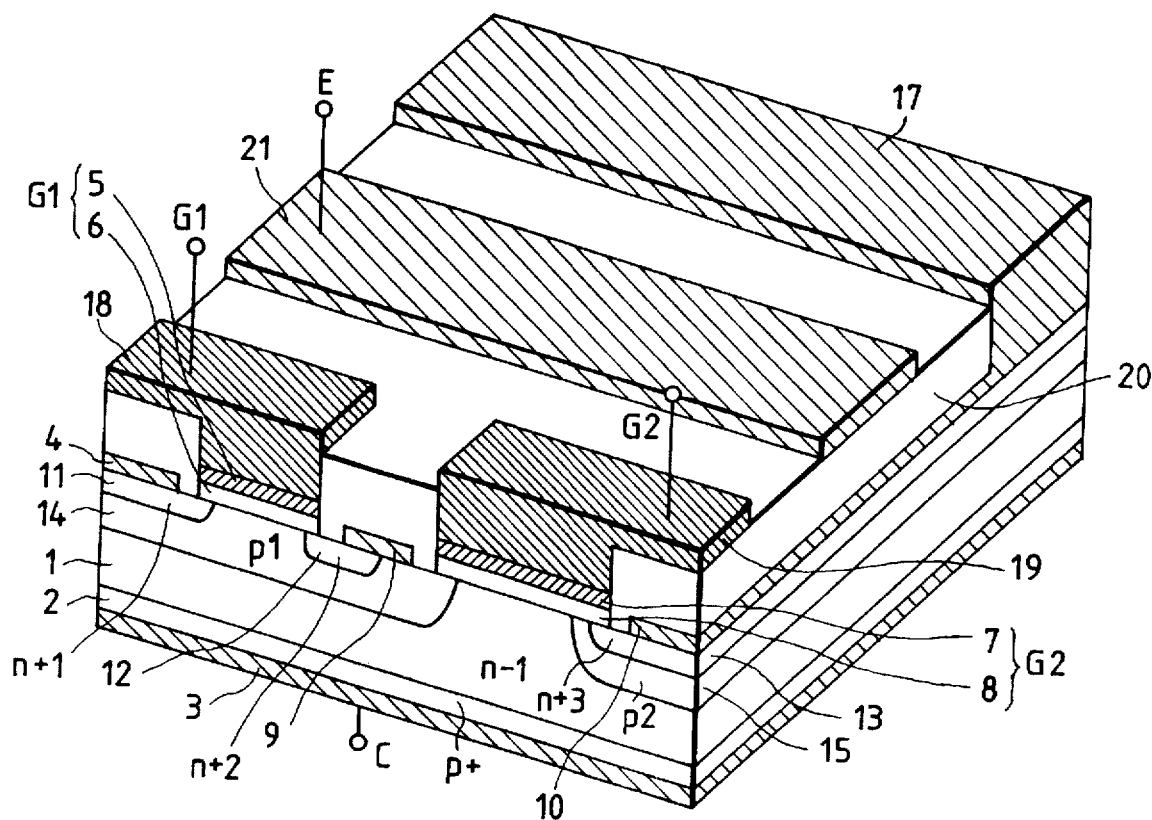
FIG. 17A is a cross sectioned perspective view of a MIS control thyristor and FIG. 17B is a waveform diagram of gate driving signals supplied to the MIS control thyristor according to the present invention.

FIG. 17A shows cross sectioned and surface structures of a unit cell of a MIS control thyristor to which cell, a p+ layer 2 is formed on the back face of a n−1 substrate (n−1 layer) 1. A collector electrode (C) 3 is provided on the p+ layer 2 through a low resistance contact. On the front face of the n−1 substrate 1 an insulated gate G1 composed of a gate electrode 5 and an insulating film 6, and an insulated gate G2 composed of a gate electrode 7 and an insulating film 8 are formed. A n+1 layer 11 and a n+2 layer 12 which reach to the bottom of the insulated gate G1 are formed on the main front surface of the n−1 substrate 1 while opposing each other with the insulated gate G1 being disposed therebetween. Further, a n+3 layer 13 which reaches to the bottom of the insulated gate G2 is formed on the main front surface of the n−1 substrate 1 at the opposite side of the n+2 layer 12 with respect to the insulated gate G2. A p1 layer 14 is provided so as to surround the n+1 layer 11 and the n+2 layer 12. A p2 layer 15 is similarly provided so as to surround the n+3 layer 13. An electrode 4 is provided on the n+1 layer 11 through a low resistance contact. An emitter electrode (E) 9 is formed on the n+2 layer 12 and the p1 layer 14 through a low resistance contact. An electrode 10 is provided on the n+3 layer 13 through a low resistance contact. The electrodes for the insulated gates Gi and G2 are connected via a low resistance wiring electrode. Further, the electrodes 4 and 10 are similarly connected by a separate low resistance wiring electrode 17. A wiring electrode 21, which contacts the emitter electrode 9 with a low resistance, is also formed. Although not illustrated in the drawing, the emitter electrode 9 and the wiring electrode 21 are connected via a contact hole provided in the insulating film 20.

Independent leading out electrodes 18 and 19 are respectively connected to the gate electrodes 5 and 7. Therefore, the biasing voltages VG1 and VG2 between the insulated gates GI and G2 and the emitter electrode can be independently controlled.

In the present embodiment, a plurality of the unit cells are connected in parallel, and between the respective electrodes, that is, the emitter electrode 9, the electrodes 4 and 10, the wiring electrodes 17 and 21 and the leading out electrodes 18 and 19, the insulating film 20 is formed. Further, the wiring electrodes 17 and 21 and the leading out electrodes 18 and 19 are respectively connected to the corresponding electrodes of other unit cells.

Figure 17B:
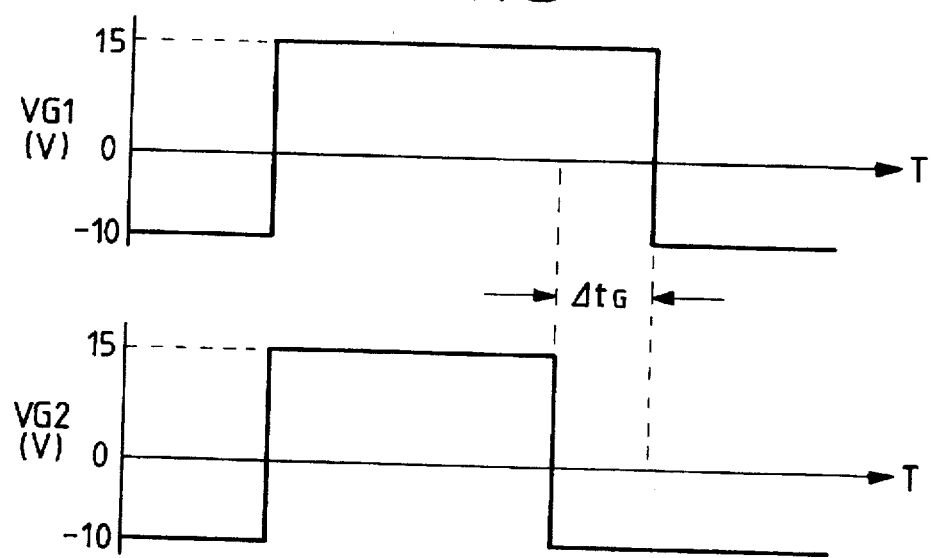

In order to turn on the MIS control thyristor of the present embodiment, the gates G1 and G2 are supplied at the same time with a positive biasing potential. Further, in order to turn off the present MIS control thyristor, at first the gate G2 is negatively biased, and then, after an interval of $\Delta tG$ (>0) as shown in FIG. 17B, the gate G1 is negatively biased. Through the negative biasing in the order of the gate G2 to gate G1 an increase of the drain potential VD during the turn off period is suppressed.

Figure 18:
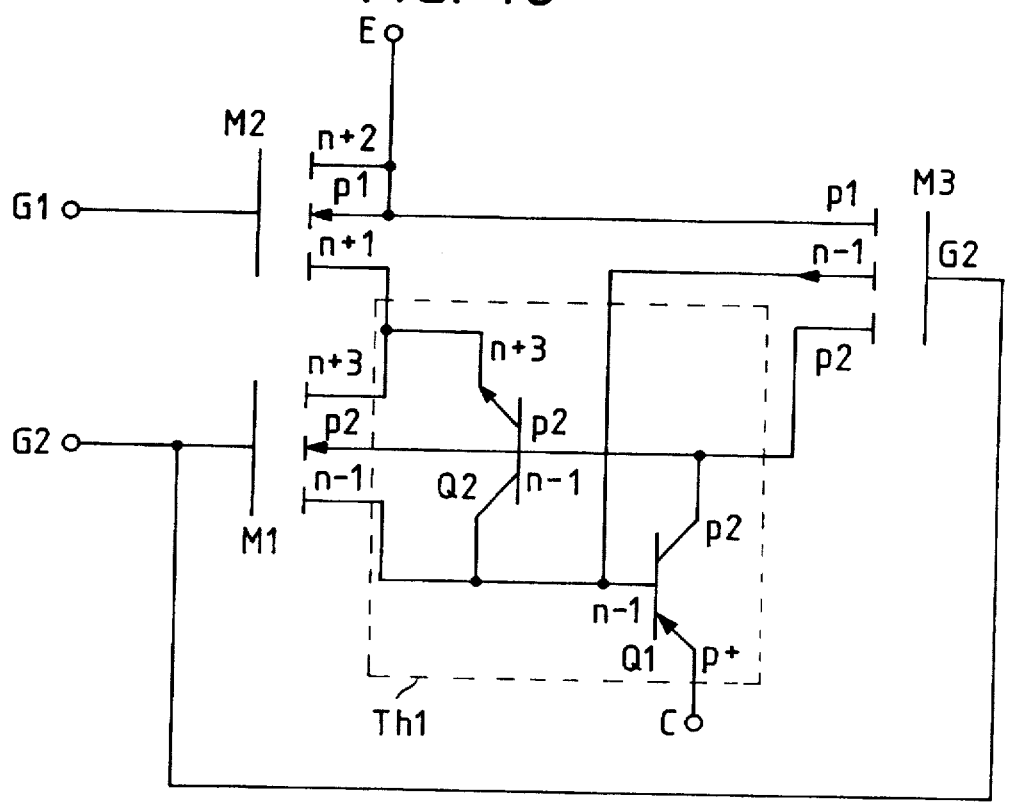
FIG. 18 is an equivalent circuit diagram of the MIS control thyristor shown in FIG. 17A.

FIG. 18 shows an equivalent circuit of the FIG. 17A embodiment. An operation of the FIG. 17A embodiment will be explained with reference to FIG. 17A, FIG. 17B and FIG. 18. When the gate G2 is negatively biased under the on condition, the n channel MISFET M2 is turned off and the p channel MISFET M3 is turned on, thereby, the p1 layer and the p2 layer are short-circuited via the p channel MISFET M3. Subsequently, when the gate G1 is negatively biased and the n channel MISFET M1 is turned off, the electron injection into the n−1 layer 1 is interrupted, the pnp transistor Q1 and the npn transistor Q2 are turned off to place the MIS control thyristor in a turn-off condition. At this moment, the collector-emitter voltage VCE increases, however the potential of the p2 layer does not rise because the p2 layer is short-circuited to the emitter electrode. For this reason, the drain potential VD also does not rise. In the FIG. 17A embodiment, the portions at the n+2 layer 12 and the p1 layer 14 short-circuited by the electrode 9, namely, the contacting portions between the electrode 9 and the p1 layer are located between the n+2 layer 12 and the gate G2. Accordingly, the short-circuited portions come close to the channel of the p channel MISFET M3 and the p2 layer, so that the short-circuiting resistance is reduced which enhances the effect of the short-circuiting.

Figure 19:
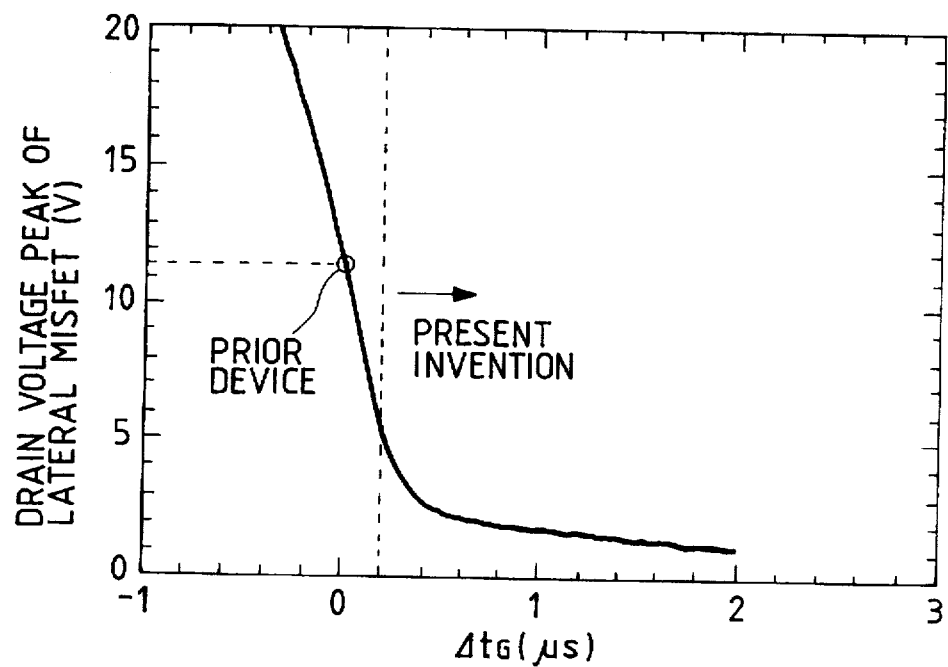
FIG. 19 is a graph which shows a relation between time lag of two gate signals and drain voltage of a MISFET.

FIG. 19 shows a relation between the offset time $\Delta tG$ and the drain potential VD obtained through a computing simulation. In the present embodiment, with the provision of the two gates G1 and G2, the offset time $\Delta tG$ can be freely varied. As seen from the drawing when the offset time $\Delta tG$ is increased, the rising of the drain potential VD can be suppressed. As a result, while keeping the advantages of easy turning on operation and a low resistance loss, which are inherent in the thyristor having a p base layer of a floating potential, a broad safe operating region is obtained at the same time.

According to the study of the present inventors, a preferable value of the offset time is $\Delta tG > 0.2$ μsec which satisfies $VD \leq 5V$.

Figure 20:
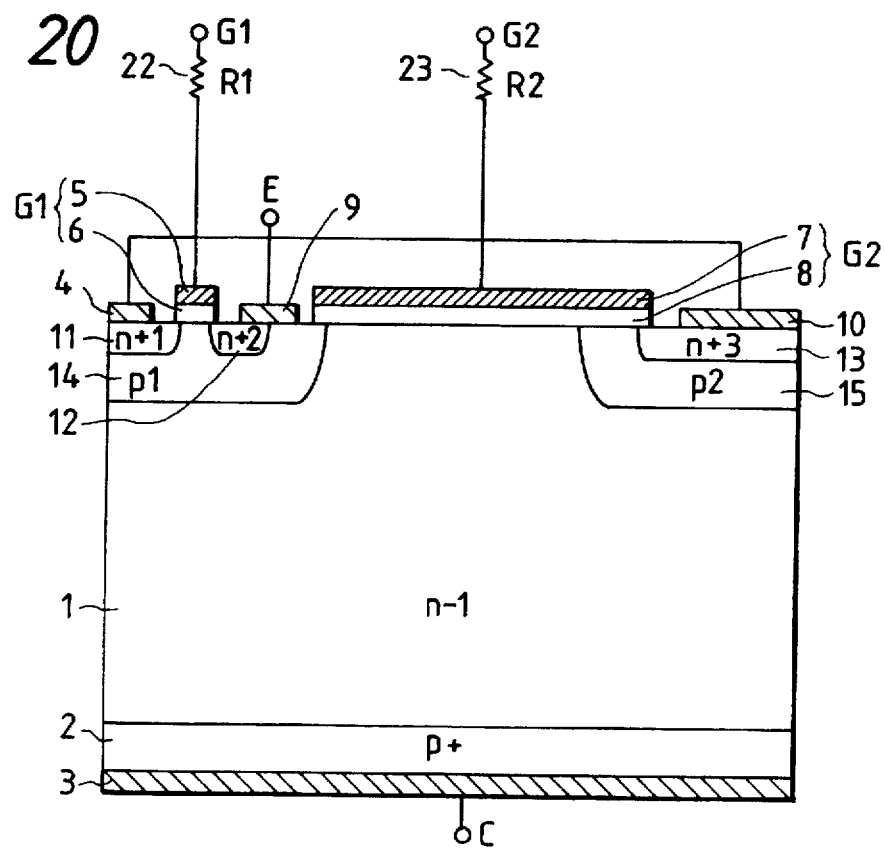
FIG. 20 is a diagram which shows a cross sectioned structure of a still further embodiment according to the present invention in which a resistor is connected to each of two gates.

FIG. 20 shows a cross sectioned structure of a still further embodiment of the present invention. The difference between the present embodiment and the FIG. 17A embodiment is that gate resistors R1 (22) and R2 (23) are respectively connected to the gates G1 and G2. The inputs for the gate resistors R1 and R2 are controlled by a common gate driving circuit. When changing the gate bias from positive to negative potential during the turn off period, the voltages applied to the respective gates decrease with the individual time constants C1×R1 and C2×R2, wherein C1 and C2 are respectively input capacitances of the gates G1 and G2. When setting the resistance R1 and R2 so as to have a relation C1×R1<C2×R2, like the FIG. 17A embodiment, after turning on the p channel MISFET M3, the n channel MISFET M1 is turned off, and so the rising of the drain potential VD can be suppressed. As a result, a broad safe operating region can be obtained. Further, in the present embodiment, unlike the FIG. 17A embodiment, it is not necessary to drive the gates G1 and G2 independently, since a single common gate driving circuit will suffice. Therefore, the constitution of the application circuit can be simplified.

Further, the resistors R1 and R2 can be formed on the semiconductor chip. For example, by making use of the resistance for the gate wiring electrodes, the values of the resistors R1 and R2 can be selected by varying their electrode configuration and resistivity so as to satisfy the required relation C1×R1<C2×R2. In the present embodiment, since the gates G1 and G2 are driven at the same time, the element can be treated as a three terminal element by connecting the two gates via a low resistance wiring electrode. In such instance, the gate wiring structure is simplified, correspondingly, the manufacturing process of the element is also simplified.

Figure 21:
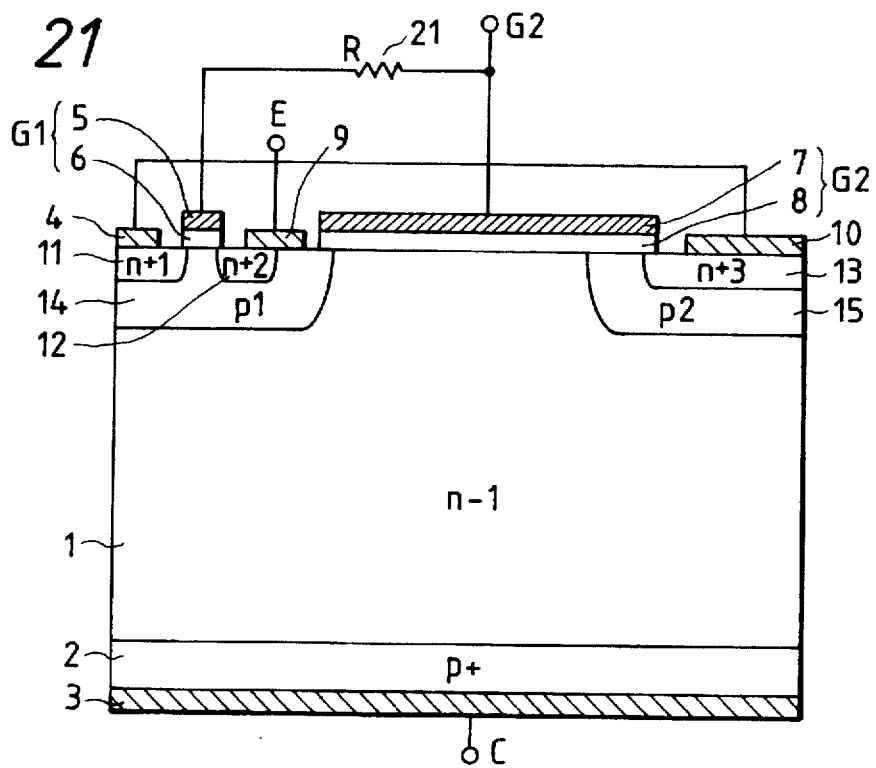
FIG. 21 is a diagram which shows a cross sectioned structure of a still further embodiment according to the present invention in which one of two gates is connected to the other gate via a resistor.

Further, rather than providing two resistors R1 and R2, a single resistor R (21) can be provided on the wiring electrode connecting the two gates and a common gate driving circuit can be connected to the gate G2 to drive the same, as in a still further embodiment shown in FIG. 21. In this instance, the resistor R can be formed by the wiring electrode connecting the two gates by varying the configuration and the resistivity thereof. Further, in the present embodiment, it is preferable to set the resistance value of the resistor R so as to satisfy a condition C1×R0.2 μsec.

Figure 22A:
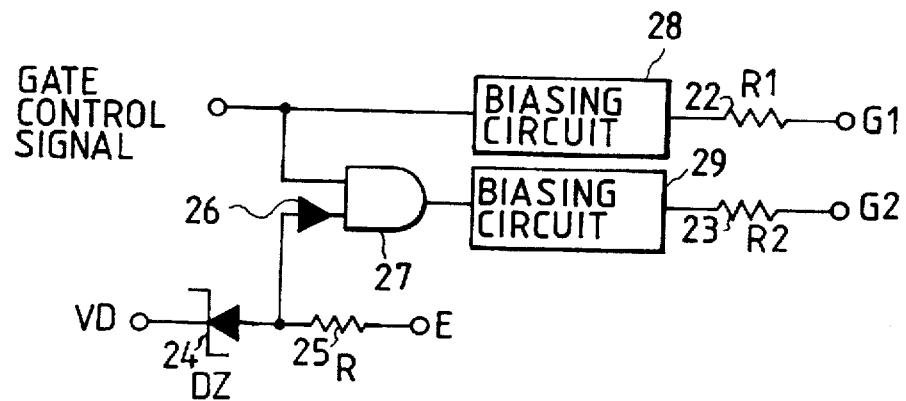
FIG. 22A is a circuit diagram of a gate driving circuit according to the present invention and FIG. 22B is a diagram which shows a cross sectioned structure of a MIS control thyristor driven thereby.
Figure 22B:
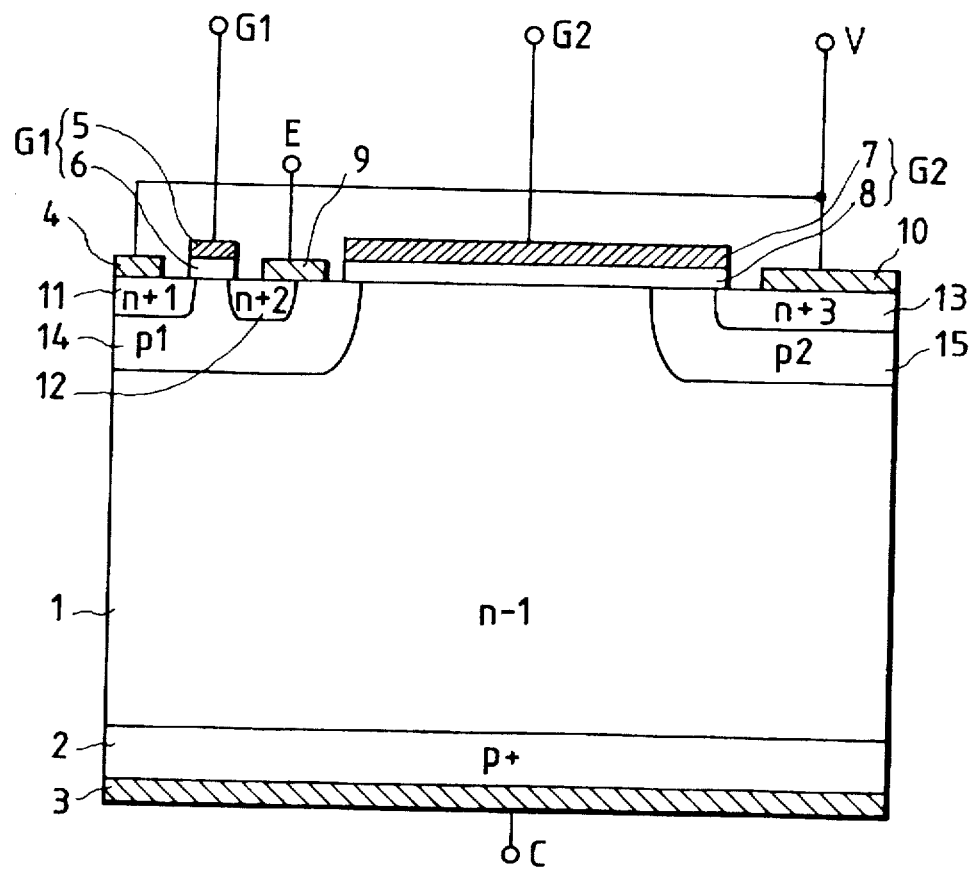

Figs.22A and 22B show a gate driving circuit and cross sectioned structure of a still further embodiment used in combination therewith according to the present invention. In the present embodiment, a terminal VD lead out from the electrode 10 is provided. The terminal VD together with the gate driving circuit receiving a gate control signal as an input, drive the gates G1 and G2. The gate driving circuit for the gate G1 is connected to a series connection of a bias applying circuit 28, which outputs positive (+15V) and negative (−5~10V) voltages depending on the gate control signal, and the gate resistor R1 (22). In the gate driving circuit for the gate G2, the VD–E voltage is divided by a serially connected zenor diode DZ24 and over voltage detection resistor R (25), a logical NOT of the voltage across the resistor R is taken into a NOT circuit 26, and a logical OR of the output from the NOT circuit 26 and the gate control signal is taken at an AND circuit 27. The output of the AND circuit 27 is inputted to a bias applying circuit 29 and is passed through a gate resistor R1 (23) to drive the gate G2. Further, the zenor voltage VDZ of the zenor diode DZ24 is set to be lower than the drain withstanding voltage VBD of the lateral MISFET as well as the sum of the withstanding voltage of the gate insulating film and the gate bias voltage.

In the present embodiment, a large collector-emitter voltage VCE is applied under a turn on condition, and a rising of the drain potential VD is suppressed. Namely, when the drain potential VD rises and exceeds the zenor voltage VDZ, a negative bias voltage is applied to the gate G2, and the p2 layer is short-circuited with the emitter electrode. Therefore, the potential rise of the p2 layer is suppressed and the rising of the drain potential VD is accordingly suppressed. For this reason, in the present embodiment, the safe operating region in the forward direction is further extended in comparison with that in the FIG. 17A embodiment. Therefore, in the present embodiment a further larger current can be controlled than that in FIG. 17A embodiment.

In the present embodiment, in order to avoid an on-voltage increase under a normal on condition it is necessary to increase the zenor voltage VDZ so that it is higher than the voltage applied to the lateral MISFET, however, a possibly lower zenor voltage VDZ is preferable to extend the safe operating region. For this reason, a zenor voltage VDZ of about 2V is preferable as one typical value.

The semiconductor element portion and the driving circuit in the present embodiment can be either integrated in a single semiconductor chip or accommodated into a single package.

Hereinabove, several embodiments of the compound semiconductor devices according to the present invention have been explained with reference to the drawings, however, in order to obtain an actual desired current carrying capacity, about 100–100,000 unit cells are integrated and the respective gate electrodes and the respective emitter electrodes in the integrated unit cells are connected to each other.

Hereinbelow, MIS control thyristors of another type than that explained above, to which the present invention is also applied, will be explained. However, the thyristor portion and the MISFET portion in the present MIS control thyristors are connected in series like the MIS control thyristor explained hereinabove.

Figure 23:
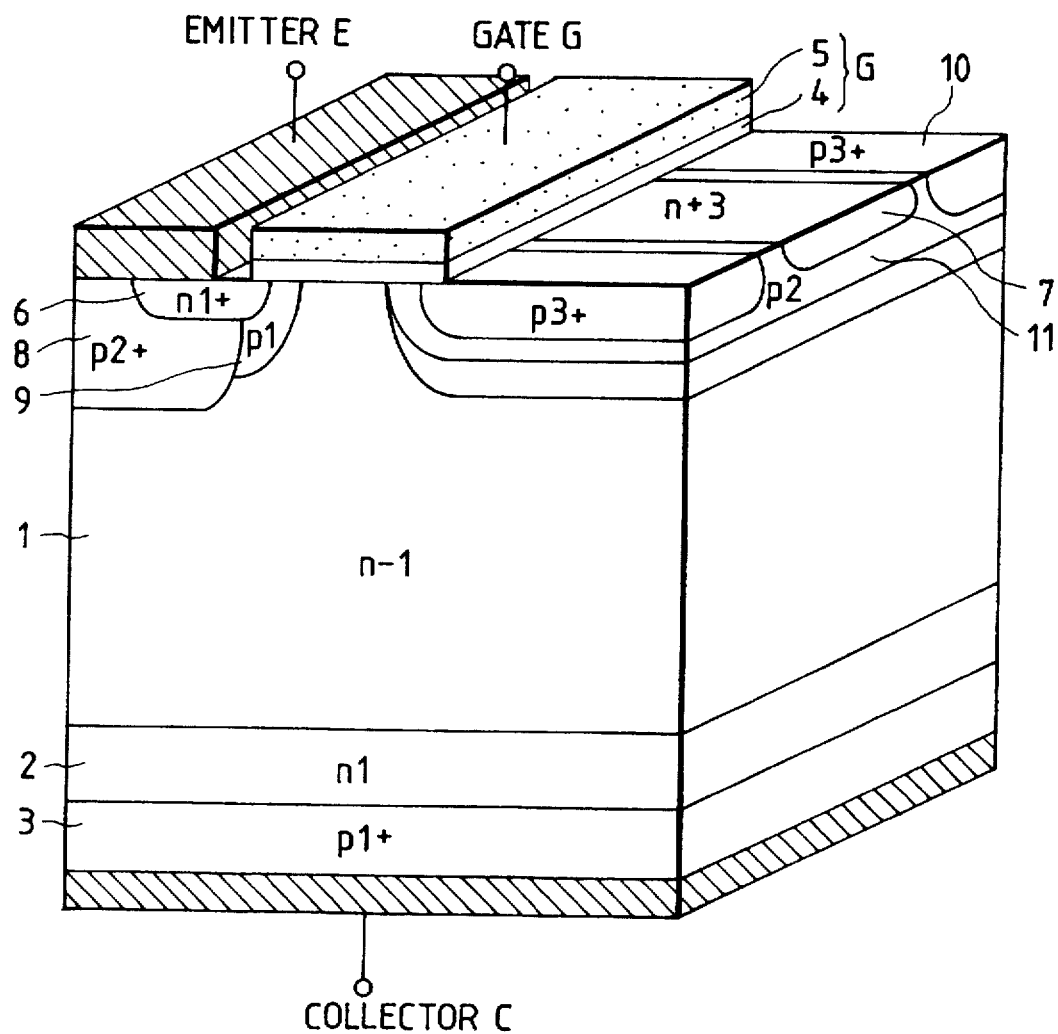
FIG. 23 is a cross sectioned perspective view of an embodiment in which the present invention is applied to another type MIS control thyristor.
Figure 24:
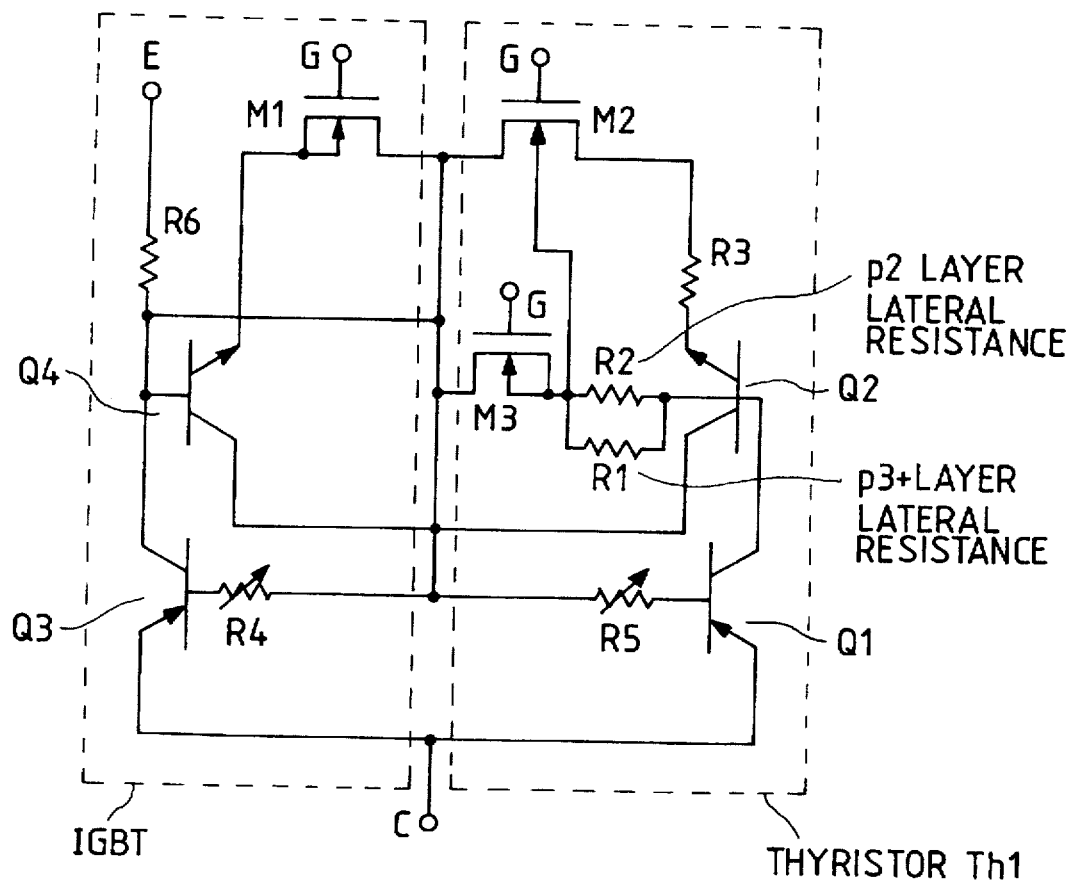
FIG. 24 is an equivalent circuit diagram of the embodiment shown in FIG. 23.

FIGS. 23 and 24 are respectively a cross sectioned perspective view of an embodiment of another type of MIS control thyristor corresponding to a unit cell thereof according to the present invention and an equivalent circuit thereof. In the present MIS control thyristor, on the back face of a n−1 substrate (n−1 layer) 1 a n1 layer 2 is provided, on the back face of the n1 layer 2 a p1+ layer 3 is provided, and further on the back face of the p1+ layer 3 a collector electrode C is provided via a low resistance contact. On the front major surface, an insulated gate G composed by an insulating film 4 and gate electrode 5, and an emitter electrode E are formed, a n+1 layer 6 is further formed so as to reach the bottom of the insulated gate G, further a p2+ layer 8 having a high impurity density and juxtaposed to the n1+ layer 6 and the emitter electrode E is formed from the major surface so as to reach to the n−1 layer 1, and still further a p1 layer 9 is provided so as to surround the n1+ layer 6. In parallel with a n+3 layer 7, a p3+ layer 10 having a high impurity density is provided so as to reach the bottom of the insulated gate G. Further, a p2 layer 11 having a low impurity density is provided which surrounds the n+3 layer 7 and the p3+ layer 10, fills up the space therebetween and reaches to the bottom of the insulated gate G.

FIG. 24 shows an equivalent circuit of the FIG. 23 embodiment. In the MIS control thyristor, a thyristor Th1 is contained which is constituted by a pnp transistor Q1 defined by the p1+ layer 3, the n−1 layer 1 and the p2 layer 11, and a npn transistor Q2 defined by the n−1 layer 1, the p2 layer 11 and the n+3 layer 7. The thyristor Th1 is connected to the emitter electrode E via the lateral resistance R3 of the n+3 layer 7, a n channel MISFET M2 formed beneath the gate G and defined by the n−1 layer 1, the p2 layer 11 and the n+3 layer 7, and a n channel MISFET M1 defined by the n1+ layer 6, the p1 layer 9 and the n−1 layer 1. Further, the pnp transistor Q1 is connected to the emitter electrode via the lateral resistance R1 of the p3+ layer 10 and lateral resistance R2 of the p2 layer 11 connected in parallel, a p channel MISFET M3 defined by the p1 layer 9, the n−1 layer 1 and the p2 layer 11 and the lateral resistance R6 of the p2+ layer 8. Still further, the MIS control thyristor includes a IGBT region defined by the MISFET M1 and a pnp transistor Q3 defined by the p1+ layer 3, the n−1 layer 1 and the p1 layer 9. In the present embodiment, since the impurity density of the p3+ layer 10 is high, the resistance R1 is low in comparison with the resistance R2. Moreover, the present MIS control thyristor further includes a parasitic thyristor constituted by a npn transistor defined by the n−1 layer 1, the p1 layer 9 and the n1+ layer 6 and the pnp transistor Q3. Resistances R4 and R5 in FIG. 24 are vertical direction resistances of the n−1 layer 1.

In the present compound semiconductor device, during the turning off process of the pnp transistor Q1 the MISFET M3 has been turned on, therefore, positive holes accumulated in the n−1 layer 1 serving as the base for the pnp transistor Q1 flow to the emitter electrode E via the resistances R1 and R2, the MISFET M3, and the resistance R6. However, in the present compound semiconductor device, the p3+ layer 10 of a low resistance having a high impurity density, for example, in a range of $1 \times 10^{17} \sim 1 \times 10^{20} cm^{-3}$ is provided, and so the positive hole current primarily flows toward the resistance R1 of the p3+ layer 10 having a low resistance, which is equivalent to reduction of the sheet resistance $\rho_S$ of the p2+ layer 11 in the formula (5). Therefore, if the lateral resistance R1 of the p3+ layer 10 is, for example, reduced to less than 1/10 of the lateral resistance R2 of the p2 layer 11, a voltage drop in the lateral direction in the p2 layer 11 hardly increases, even if the switching current is increased to 10 times. For this reason, the present compound semiconductor device can switch a large current. Further, in such instance, even when the impurity density of the p2 layer 11 is reduced, the voltage drop handly increases, therefore the resistance loss therein can be reduced.

One of the advantages of providing the p3+ layer 10 is that the thyristor Th1 operates uniformly over the entire surface, because with the provision of the p3+ layer 10,the lateral resistance of the base layer, that is, the p2 layer 11, of the npn transistor Q2 is reduced, and an emitter current concentrating effect, in other words, an emitter clouding effect due to the base resistance of the npn transistor Q2, is hardly induced. Therefore, break down of the semiconductor element due to current concentration into the thyristor is prevented such that a larger current can flow in the present compound semiconductor device can flow a larger current than that permitted in the conventional element without causing break down of the device.

Figure 25:
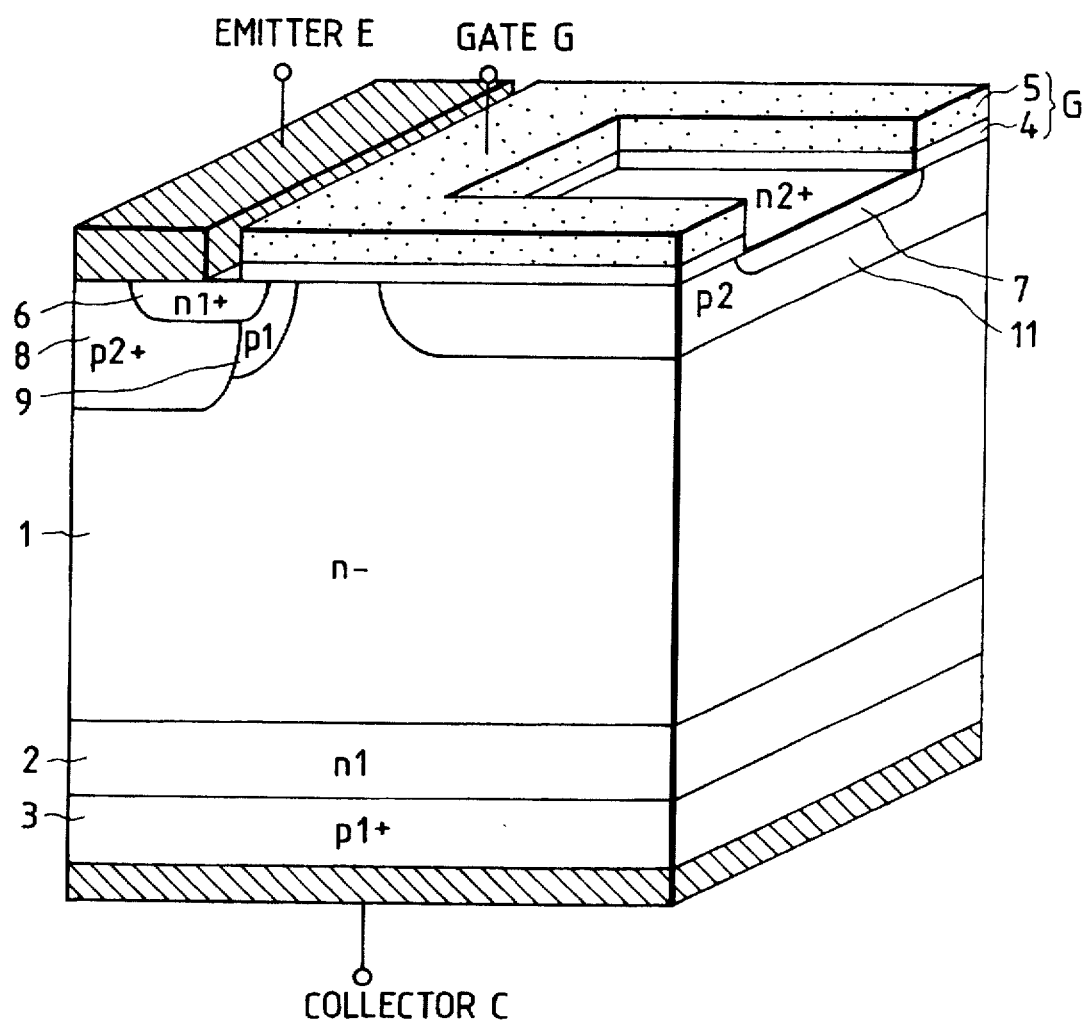
FIG. 25 is a cross sectioned perspective view of another embodiment in which the present invention is applied to another type MIS control thyristor.

Another embodiment representing another type of MIS control thyristor according to the present invention will be explained with reference to FIG. 25. Only the difference between the present semiconductor device and the FIG. 23 embodiment will be explained below. In place of the p3+ layer 10 in the FIG. 23 embodiment, even over the substrate major surface where the p3+ layer 10 is provided in the FIG. 23 embodiment, the insulated gate G composed of the insulating film 4 and the gate electrode 5 is formed, and beneath the insulated gate G the p2 layer 11 is provided as in the FIG. 23 embodiment.

Figure 26:
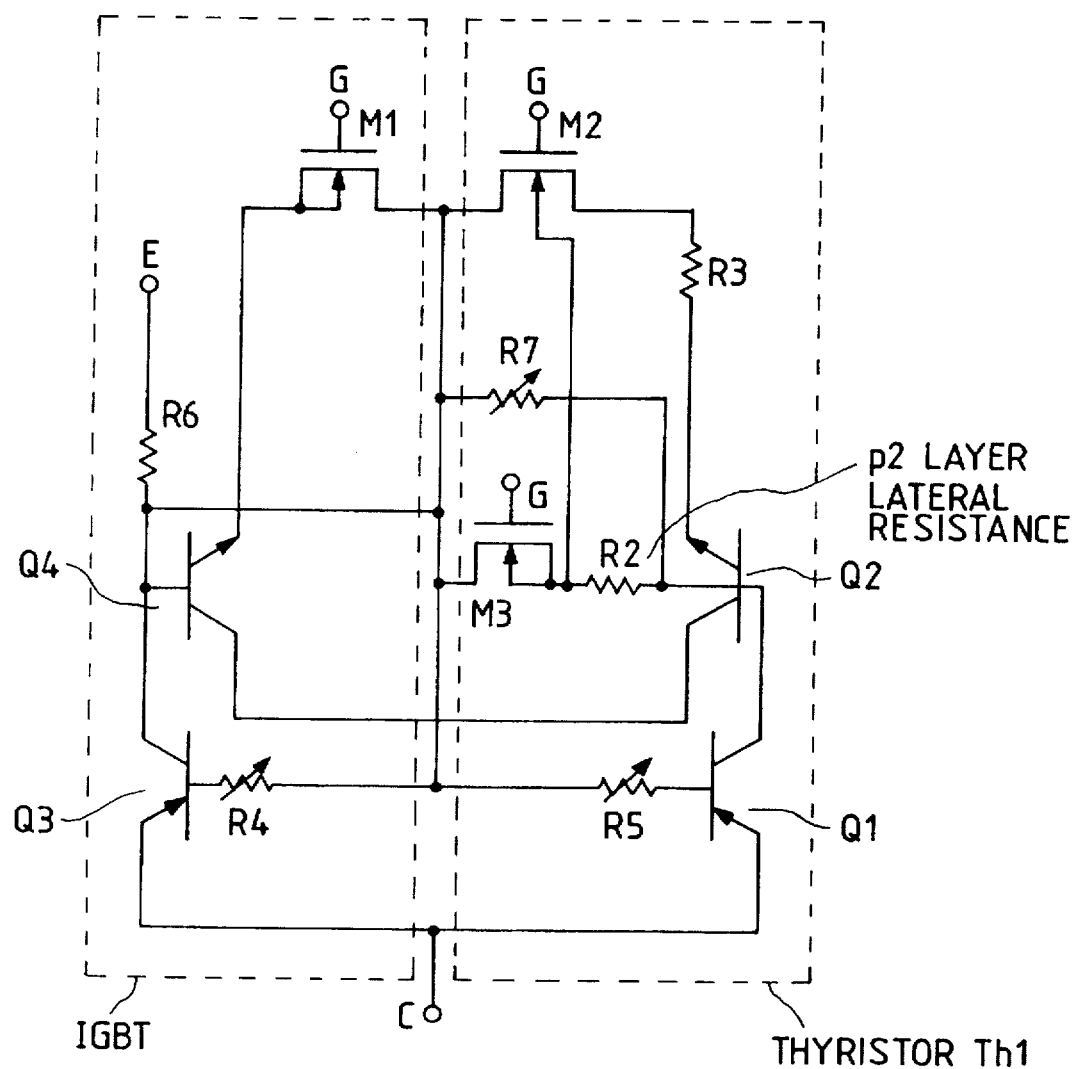
FIG. 26 is an equivalent circuit diagram of the embodiment shown in FIG. 25.

FIG. 26 shows an equivalent circuit of the present compound semiconductor device. The difference between the present equivalent circuit and FIG. 24 equivalent circuit is that resistance R7 is provided in place of the resistance R1. Herein, the resistance R7 is the lateral resistance of the p2 layer 11 beneath the insulated gate G.

In the present compound semiconductor device, the surface of the p2 layer 11 beneath the insulated gate G is occupied by p type conductors and the resistance R7 drastically decreases. As a result, the resistance R7 operates in the same manner as the resistance R1 in the FIG. 23 embodiment, thereby, substantially the same advantages as obtained in the FIG. 23 embodiment are similarly obtained.

Figure 27:
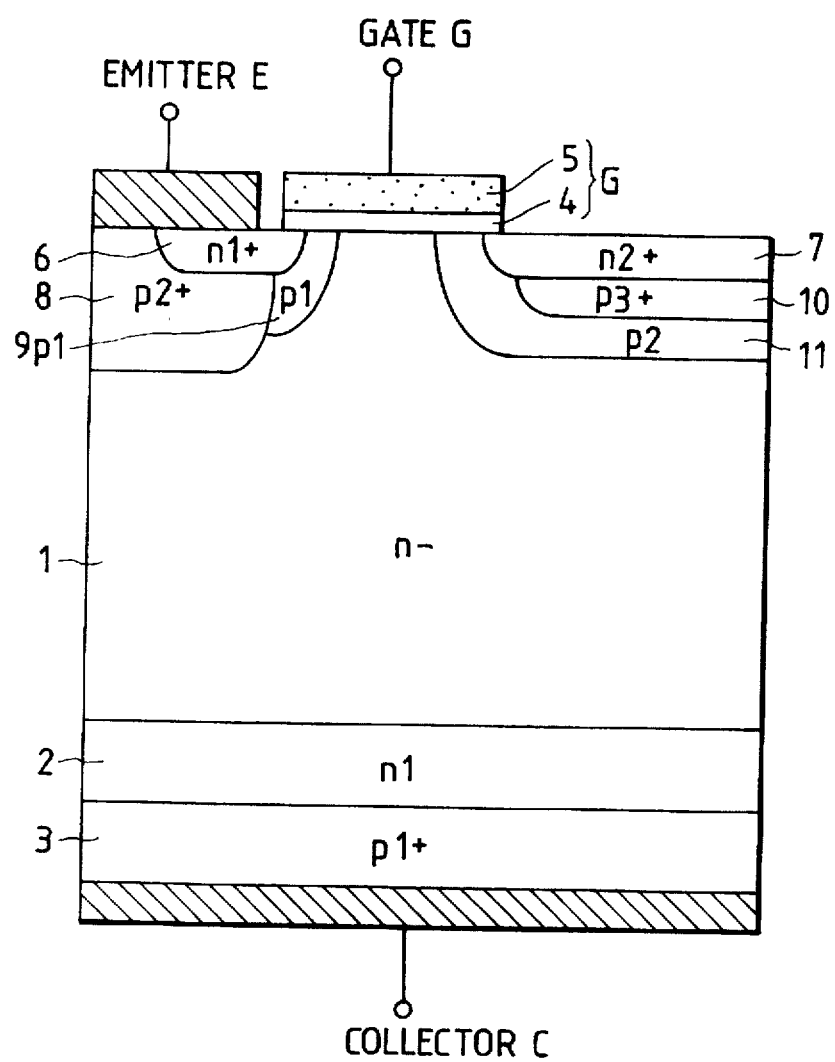
FIG. 27 is a diagram which shows a cross sectioned view of still another embodiment in which the present invention is applied to another type MIS control thyristor.

Still another embodiment representing another type of MIS control thyristor according to the present invention will be explained with reference to FIG. 27. The difference between the present compound semiconductor device and the FIG. 23 embodiment is that the n2+ layer 7 is provided over the entire surface of the thyristor region, and further the p3+ layer 10 is provided below the n2+ layer 7. Further, in the present embodiment, the n2+ layer 7 beneath the insulated gate G is directly connected to the p2 layer 11. For this reason, in the present compound semiconductor device, the reverse direction withstanding voltage of the pn junction defined by the thyristor n emitter, that is the n2+ layer 7, beneath the insulated gate G and the thyristor p base, that is the p2 layer 11, is equivalent to that of the conventional device. However, with the provision of the p3 layer 10, the lateral resistance of the thyristor p base layer, that is the p2 layer 11, is reduced. Namely, the sheet resistance $\rho_S$ of the p2 layer is equivalently reduced, which fulfills the condition described by the formula (5) and a reverse bias voltage applied on the above mentioned pn junction during the turn off period is reduced. Therefore, the present compound semiconductor device can switch a larger current. Further, in the present embodiment, since the p3 layer 10 directly contacts the n2+ layer 7, the thyristor Th1 operates even more uniformly over the entire surface in comparison with the FIG. 23 embodiment, thereby a possible break down of the semiconductor element is effectively prevented.

A further embodiment representing another type of MIS control thyristor according to the present invention will be explained with reference to FIG. 28. The difference between the present compound semiconductor device and the conventional device is that a p3 layer 12 having a low impurity density, for example, of $1 \times 10^{14} \sim 1 \times 10^{16} cm^{-3}$, is provided beneath the insulated gate G. With this feature in the present compound semiconductor device, the impurity density of the pn junction beneath the insulated gate G where an application of reverse voltage is maximized is reduced, and so the reverse direction withstanding voltage is improved. Therefore, even if a large voltage drop is induced, no turn off failure is caused which permits switching of a large current. For example, when assuming that the junction depth Xj=1 μm of the n2+ layer 7 and the impurity density NXj= $10^{17} cm^{-3}$ at the pn junction of the p2 layer 11 in the conventional device, the reverse direction withstanding voltage $V_B$=10V. On the other hand, when the p3 layer 12 having an impurity density of $1 \times 10^{15} cm^{-3}$ is provided according to the present embodiment, the reverse direction withstanding voltage $V_B$ increases up to 36V. Therefore, according to the condition of the formula (5), the switchable current can be increased upto 3.6 times. Further, in contrast to the FIG. 23 embodiment, the p2 layer 11 having a low impurity density is provided beneath the primary thyristor, and so the thyristor can be easily turned on and the resistance loss therethrough is reduced. Accordingly, the reduction of the resistance loss as well as the increase of the switchable current in comparison with the conventional device are obtained at the same time.

Figure 28:
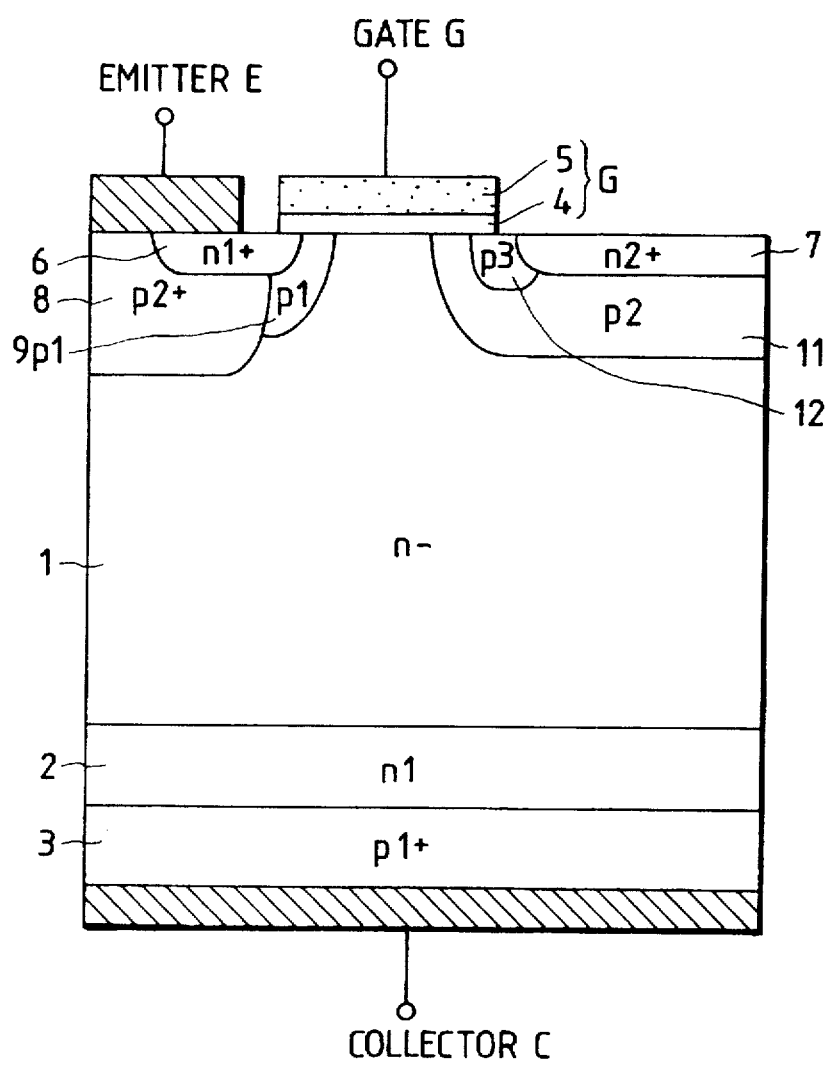
FIG. 28 is a diagram which shows a cross sectioned view of a further embodiment in which the present invention is applied to another type MIS control thyristor.

Further, in place of the p3 layer 12 in the FIG. 28 embodiment, an n type layer having a low impurity density, for example, of $1 \times 10^{16} \sim 1 \times 10^{18} cm^{-3}$ can be provided.

Figure 29:
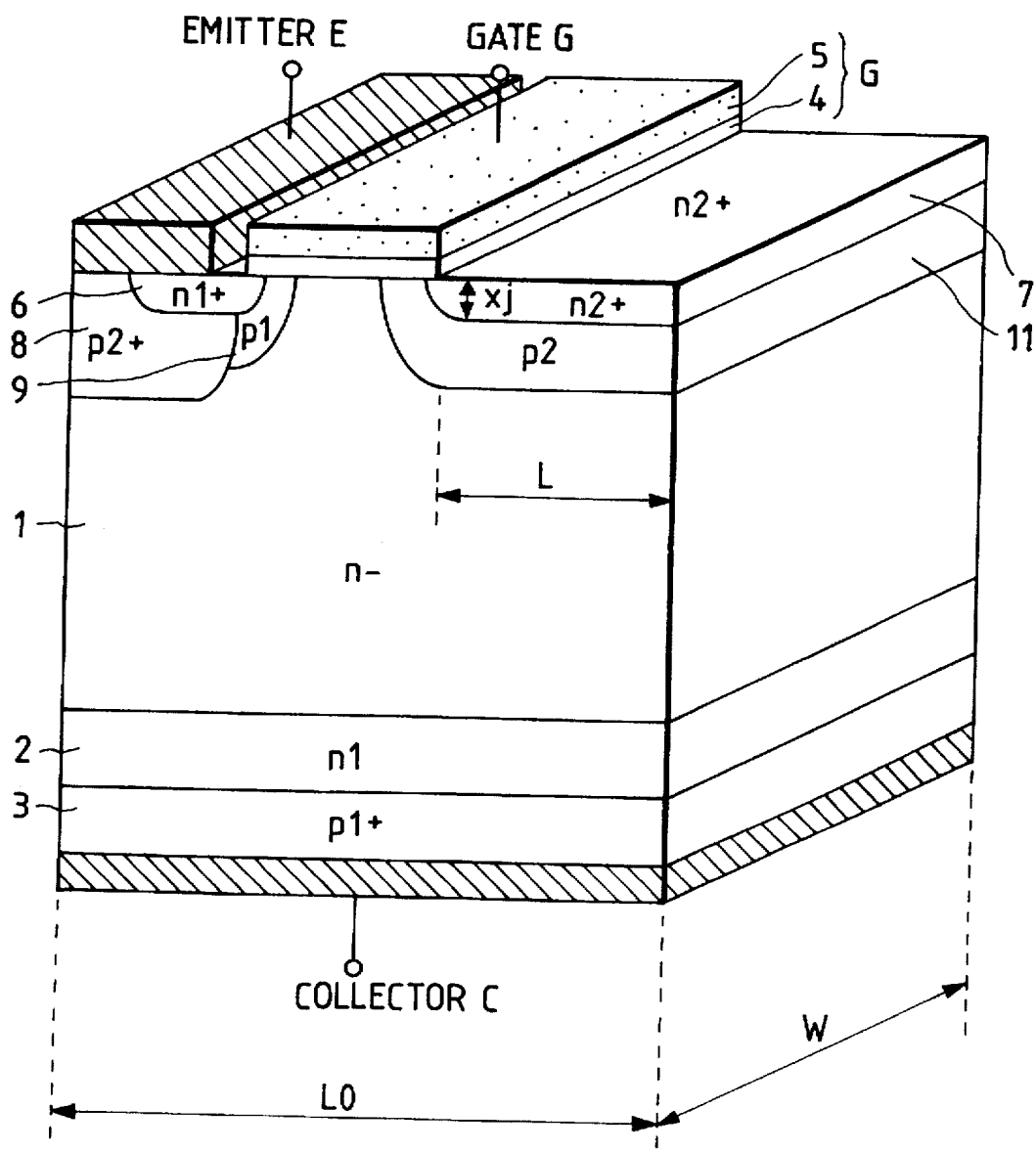
FIG. 29 is a cross sectioned perspective view of an embodiment of a MIS control thyristor which satisfies the size relation defined in formula (5)

In the above embodiments as explained in connection with FIGS. 23, 25, 27 and 28, some type of layer is added so as to satisfy the condition of the formula (5) for a further larger current however, the compound semiconductor device as illustrated in FIG. 29 also can achieve the object of the present invention, if the sizes of respective components are selected to satisfy the condition required by formula (5) without introducing an additional layer.

Figure 30:
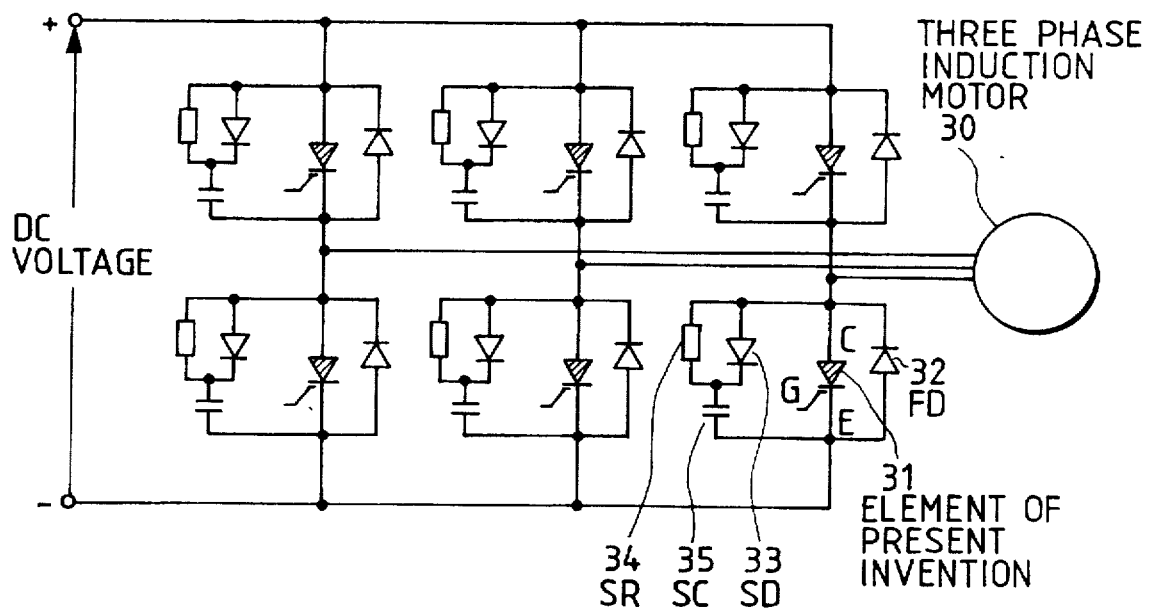
FIG. 30 is a diagram which shows an example of electric power conversion devices to which the compound semiconductor device according to the present invention is applied.

FIG. 30 shows a circuit diagram of an inverter device used for driving an electrical motor, the inverter device representing an example of an electric power conversion device, which is constituted by making use of the compound semiconductor device according to the present invention. In FIG. 30, the electrical power conversion device, a voltage type inverter circuit, is constituted by six compound semiconductor devices according to the present invention, and with the thus constituted inverter circuit, a three phase induction motor 30 is controlled. The unit circuit for the voltage type inverter circuit is constituted by a compound semiconductor device 31 according to the present invention, a flywheel diode 32, a snubber diode 33, a snubber resistance 34 and a snubber condenser 35. With the inclusion of the compound semiconductor device 31 according to the present invention, the resistance loss of which is reduced in comparison with the conventional device, the resistance loss in the inverter device is reduced and the capacity thereof is increased. Further, because of the extended safe operating region of the compound semiconductor device, the snubber circuit can be reduced or eliminated. Accordingly, a reduction in the resistance loss in the electric power conversion device and a down sizing thereof can be realized.

In addition, when the compound semiconductor device as shown in FIG. 17A is used for an electric power conversion device, a separate gate driving circuit which generates the gate voltages VG1 or VG2 is connected to the gates G1 or G2 in the respective compound semiconductor devices.

We claim:

1. A compound semiconductor device comprising:

a first semiconductor region of first conductivity type;

a second semiconductor region of second conductivity type provided on said first semiconductor region of first conductivity type;

a third semiconductor region of first conductivity type and a fourth semiconductor region of first conductivity type both provided in said second semiconductor region;

a fifth semiconductor region of second conductivity type and a sixth semiconductor region of second conductivity type both provided in said third semiconductor region;

a seventh semiconductor region of second conductivity type provided in said fourth semiconductor region;

a first insulated gate formed across said fifth semiconductor region and said sixth semiconductor region;

a second insulated gate formed across said second semiconductor region, said fourth semiconductor region and said seventh semiconductor region;

a first electrode connected through a low resistance to said first semiconductor region;

a second electrode short-circuiting said third semiconductor region with said sixth semiconductor region; and a gate electrode short-circuiting said first insulated gate with said second insulated gate, wherein said fifth semiconductor region and said seventh semiconductor regions are connected with a low resistance and a withstanding voltage between said fifth semiconductor region and said sixth semiconductor region is set to be larger than a withstanding voltage between said fourth semiconductor region and said third semiconductor region.

2. A compound semiconductor device according to claim 1, wherein a distance between a part of said third semiconductor region and a part of said fourth semiconductor region is selected to be shorter than a distance between another part of said third semiconductor region and another part of said fourth semiconductor region.

3. A compound semiconductor device according to claim 1, further comprising an eighth semiconductor region provided at least in a part of a spacing region between said third semiconductor region and said fourth semiconductor region.

4. A compound semiconductor device according to claim 3, wherein said eighth semiconductor region is of a first conductivity type and is electrically connected to said second electrode.

5. A compound semiconductor device according to claim 1, further comprising a ninth semiconductor region of second conductivity type having a lower carrier density than that of said fifth semiconductor region, provided in said third semiconductor region so as to surround said fifth semiconductor region.

6. A compound semiconductor device according to claim 1, further comprising a tenth semiconductor region of second conductivity type having a lower carrier density than that of said fifth semiconductor region provided in said third semiconductor region beneath a part of said first insulated gate and juxtaposed to said fifth semiconductor region.

7. A compound semiconductor device according to claim 1, further comprising an eleventh semiconductor region of first conductivity type, having a lower carrier density than that of said third semiconductor region, provided in said third semiconductor region so as to surround said fifth semiconductor region.

8. A compound semiconductor device according to claim 1, further comprising a zenor diode having a zenor voltage lower than the withstanding voltage between said fifth semiconductor region and said sixth semiconductor region, wherein the cathode electrode of said zenor diode is connected through a low resistance to said fourth semiconductor region and the anode electrode of said zenor diode is contacted with a low resistance to said second electrode.

9. A device comprising, a plurality of a compound semiconductor devices according to claim 1, wherein portions of said fourth semiconductor region and said third semiconductor regions of which the withstanding voltage therebetween is lower than the withstanding voltage between said fifth semiconductor region and said sixth semiconductor region, are alternately arranged both in a first direction from said fourth semiconductor region to said third semiconductor region and in a second direction perpendicular to said first direction.

10. A compound semiconductor device according to claim 1, further comprising a twelfth semiconductor region of first conductivity provided at least in a part of a spacing region between said third semiconductor region and said fourth semiconductor region in such a manner as to contact both said third semiconductor region and said fourth semiconductor region.

11. A compound semiconductor device according to claim 10, wherein the sheet carrier density of said twelfth semiconductor region is less than $1 \times 10^{13} cm^{-2}$.

12. A compound semiconductor device according to claim 1, wherein the dielectric withstanding voltage between said fifth semiconductor region and said first insulated gate is selected to be higher than the withstanding voltage between said third semiconductor region and said fourth semiconductor region.

13. A compound semiconductor device according to claim 12, wherein the withstanding voltage between said third semiconductor region and said fourth semiconductor region is selected to be less than ½ of the dielectric withstanding voltage between said fifth semiconductor region and said first insulated gate.

14. A compound semiconductor device comprising:

a first semiconductor region of first conductivity type;

a second semiconductor region of second conductivity type provided on said first semiconductor region of first conductivity type;

a third semiconductor region of first conductivity type and a fourth semiconductor region of first conductivity type both provided in said second semiconductor region;

a fifth semiconductor region of second conductivity type and a sixth semiconductor region of second conductivity type both provided in said third semiconductor region;

a seventh semiconductor region of second conductivity type provided in said fourth semiconductor region;

a first electrode connected through a low resistance to be said first semiconductor region;

a second electrode connected through a low resistance to said third semiconductor region and said sixth semiconductor region;

a third electrode electrically connected to said fifth semiconductor region and to said seventh semiconductor region;

a first insulated gate provided on the surface of said third semiconductor region across said fifth semiconductor region and said sixth semiconductor region; and a second insulated gate provided on the surface of said second semiconductor region across said third semiconductor region and said fourth semiconductor region, said second insulated gate being negatively biased prior to removing the positive bias of said first insulated gate during turn off period.

15. A compound semiconductor device according to claim 14, wherein the product of the gate capacity and the gate resistance of said first insulated gate is larger than the product of the gate capacity and the gate resistance of said second insulated gate by 0.2 μsec.

16. A driving method for a compound semiconductor device comprising:

a first semiconductor region of first conductivity type;

a second semiconductor region of second conductivity type provided on said first semiconductor region of first conductivity type;

a third semiconductor region of first conductivity type and a fourth semiconductor region of first conductivity type both provided in said second semiconductor region;

a fifth semiconductor region of second conductivity type and a sixth semiconductor region of second conductivity type both provided in said third semiconductor region;

a seventh semiconductor region of second conductivity type provided in said fourth semiconductor region;

a first electrode connected through a low resistance to said first semiconductor region;

a second electrode connected through a low resistance to said third semiconductor region and said sixth semiconductor region;

a third electrode electrically connected to said fifth semiconductor region and to said seventh semiconductor region;

a first insulated gate provided on the surface of said third semiconductor region across said fifth semiconductor region and said sixth semiconductor region; and a second insulated gate provided on the surface of said second semiconductor region across said third semiconductor region and said fourth semiconductor region, wherein said driving method comprises the steps of:

negatively biasing said second insulated gate; and removing the positive bias of said first insulated gate after said second insulated gate is negatively biased.

17. A driving method for compound semiconductor device according to claim 16, wherein the positive bias of said first insulated gate is removed at least 0.2 μsec after said second insulated gate is negatively biased.

18. A compound semiconductor device comprising:

an n type substrate;

a first p type layer formed on the back face of said n type substrate;

a collector electrode provided adjacent to the back face of said first p type layer;

an insulated gate and an emitter electrode provided on a part of the front face of said n type substrate;

a first n type layer, a part of which contacts the bottom of said insulated gate;

a second n type layer formed beneath said insulated gate and said emitter electrode and contacting thereto;

a second p type layer contacting the bottom of said second n type layer and contacting the top of said n type substrate;

a third p type layer contacting said insulated gate, said second n type layer, said second p type layer and said n type substrate; and a fourth p type layer contacting said first n type layer and the bottom of said insulated gate, wherein the respective components of said device are designed to satisfy the following condition;

$$\rho S < V_B/(J \times L_O \times L_P)$$

wherein, J is a current density of a current which flows in from said n type substrate and flows through said fourth p type layer toward said insulated gate. $L_p$ is the length of said fourth p type layer taken along the current flowing direction. $L_O$ is the length in said n type substrate taken along the current flowing direction. $\rho_S$ is the sheet resistance of said fourth p type layer and $V_B$ is the withstanding voltage of the pn junction formed by said first n type layer and said fourth p type layer beneath said insulated gate.

19. In an electric power conversion device in which a DC voltage is applied to both ends of a series connection of a plurality of switching elements and an AC output is taken out from the respective junctions of the plurality of switching elements connected in series, said switching element is the compound semiconductor device according to claim 1.

20. In an electric power conversion device in which a DC voltage is applied to both ends of a series connection of a plurality of switching elements and a AC output is taken out from the respective junctions of the plurality of switching elements connected in series, said switching element is the compound semiconductor device according to claim 14.

21. In an electric power conversion device in which a DC voltage is applied to both ends of a series connection of a plurality of switching elements and a AC output is taken out from the respective junctions of the plurality of switching elements connected in series, said switching element is the compound semiconductor device according to claim 18.

* * * * *